(12) United States Patent
Sohn et al.

(10) Patent No.: US 9,626,244 B2
(45) Date of Patent: Apr. 18, 2017

(54) MEMORY DEVICE FOR PERFORMING ERROR CORRECTION CODE OPERATION AND REDUNDANCY REPAIR OPERATION

(71) Applicant: Samsung Electronics, Ltd., Suwon-si (KR)

(72) Inventors: Young-soo Sohn, Seoul (KR); Kwang-il Park, Yongin-si (KR); Chul-woo Park, Yongin-si (KR); Jong-pil Son, Seongnam-si (KR); Jae-youn Youn, Seoul (KR); Hoi-ju Chung, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 15 days.

(21) Appl. No.: 14/208,795

(22) Filed: Mar. 13, 2014

(65) Prior Publication Data

US 2014/0317469 A1 Oct. 23, 2014

(30) Foreign Application Priority Data

Apr. 19, 2013 (KR) .................. 10-2013-0043815

(51) Int. Cl.
*G11C 29/44* (2006.01)
*G11C 29/42* (2006.01)
(Continued)

(52) U.S. Cl.
CPC .......... *G06F 11/1052* (2013.01); *G11C 29/42* (2013.01); *G11C 29/4401* (2013.01);
(Continued)

(58) Field of Classification Search
CPC . G06F 11/1052; G11C 29/808; G11C 29/848; G11C 29/4401; G11C 29/42; G11C 2029/0409; G11C 2029/0411
(Continued)

(56) References Cited

U.S. PATENT DOCUMENTS 4,768,193 A * 8/1988 Takemae ............. G06F 11/1008
714/711
5,914,907 A * 6/1999 Kobayashi ............. G11C 29/84
365/200
(Continued)

FOREIGN PATENT DOCUMENTS

| JP | 2005-346822 | 12/2005 |
| JP | 2006-286135 | 10/2006 |
| KR | 10-2007-0072228 A | 7/2007 |

Primary Examiner — James C Kerveros
(74) Attorney, Agent, or Firm — Muir Patent Law, PLLC

(57) ABSTRACT

Provided are a memory device and a memory module, which perform both an ECC operation and a redundancy repair operation. The memory device repairs a single-bit error due to a 'fail' cell by using an error correction code (ECC) operation, and also repairs the 'fail' cell by using a redundancy repair operation when the 'fail' cell is not repairable by the ECC operation. The redundancy repair operation includes a data line repair and a block repair. The ECC operation may change a codeword corresponding to data per one unit of memory cells including the 'fail' cell, and may also change the size of parity bits regarding the changed codeword.

23 Claims, 23 Drawing Sheets

(51) Int. Cl.
*G11C 29/04* (2006.01)
*G11C 29/00* (2006.01)
*G06F 11/10* (2006.01)

(52) U.S. Cl.
CPC .......... *G11C 29/808* (2013.01); *G11C 29/848* (2013.01); *G11C 2029/0409* (2013.01); *G11C 2029/0411* (2013.01)

(58) Field of Classification Search
USPC .......................................... 714/710, 711, 764
See application file for complete search history.

(56) References Cited

U.S. PATENT DOCUMENTS

| | | | |
|---|---|---|---|
| 6,584,543 B2 | 6/2003 | Williams et al. | |
| 7,085,971 B2 | 8/2006 | Barth, Jr. et al. | |
| 7,248,514 B2* | 7/2007 | Nishihara | G11C 29/44 365/200 |
| 7,373,583 B2 | 5/2008 | Hummler | |
| 7,386,771 B2* | 6/2008 | Shuma | G06F 11/1008 714/710 |
| 7,401,270 B2* | 7/2008 | Hummler | G11C 29/44 714/710 |
| 7,408,824 B2 | 8/2008 | Hoya et al. | |
| 7,594,157 B2* | 9/2009 | Choi | G11C 11/5628 365/185.09 |
| 7,954,028 B2* | 5/2011 | Barth, Jr. | G11C 29/44 714/733 |
| 8,001,450 B2 | 8/2011 | Onishi et al. | |
| 8,069,377 B2* | 11/2011 | Singh | G01J 3/02 714/711 |
| 8,195,978 B2 | 6/2012 | Flynn et al. | |
| 2003/0204798 A1* | 10/2003 | Adams | G06F 11/1008 714/723 |
| 2006/0184856 A1* | 8/2006 | Suzuki | G06F 11/1044 714/758 |
| 2007/0255981 A1* | 11/2007 | Eto | G06F 11/1008 714/710 |
| 2008/0148114 A1* | 6/2008 | Barth | G11C 29/44 714/711 |
| 2011/0041016 A1* | 2/2011 | O'Connell | G06F 11/1048 714/711 |

* cited by examiner

MEMORY DEVICE FOR PERFORMING ERROR CORRECTION CODE OPERATION AND REDUNDANCY REPAIR OPERATION

CROSS-REFERENCE TO RELATED APPLICATIONS

This application claims the benefit of priority to Korean Patent Application No. 10-2013-0043815, filed on Apr. 19, 2013, in the Korean Intellectual Property Office, the disclosure of which is incorporated herein in its entirety by reference.

BACKGROUND

Advancements in semiconductor manufacturing technology have led to an increase in the memory capacity of semiconductor memory devices. As a microfabrication process technology has advanced, the number of 'fail' memory cells has increased. In this case, not only the yield of a process of manufacturing a semiconductor memory device decreases but also a memory capacity thereof cannot be guaranteed. Accordingly, there is a need to develop methods of repairing 'fail' cells to improve the yield of a process of manufacturing a semiconductor memory device.

SUMMARY

The disclosed embodiments relate to semiconductor memory devices, and more particularly, to a memory device for performing both an error correction code (ECC) operation and a redundancy repair operation in order to increase a fail repair rate and a memory module including the memory device.

Certain embodiments provide a memory device for selectively performing an error correction code (ECC) operation and a redundancy repair operation according to types of 'fail' cells.

According to one embodiment, there is provided a memory device including: a plurality of first memory cell blocks including first memory cells; a second memory cell block including second memory cells, the second memory cell block storing in the second memory cells parity bits of an error correction code (ECC) operation for repairing a fail cell from among the first memory cells in the first memory cell blocks; a control logic circuit for storing an address of the fail cell, comparing an address applied from the outside with the address of the fail cell, and repairing the fail cell by using a redundancy repair operation of the second memory cell block when the fail cell is not repairable by the ECC operation; and an ECC circuit for performing the ECC operation regarding a codeword corresponding to data per one word line of the first memory cells including the fail cell.

According to one embodiment, the memory device is part of a memory apparatus. The memory apparatus may include a printed circuit board, and a plurality of memory chips mounted on the printed circuit board. Each of the plurality of chips may include the memory device.

According to another embodiment, there is provided a memory device including: a plurality of first memory cell blocks including first memory cells; an error correction code (ECC) circuit configured to generate first parity bits regarding a first codeword corresponding to data per one word line including an error bit due to a fail cell of the first memory cells and to generate second parity bits regarding a second codeword obtained by changing the size of the first codeword; and a second memory cell block including second memory cells, the second memory cell block configured to store the first parity bits or the second parity bits in the second memory cells.

According to one embodiment, each of the first memory cell blocks is a first memory chip mounted on a printed circuit board, the second memory cell block is a second memory chip mounted on the printed circuit board, and the printed circuit board, the first memory chips, and the second memory chip form a memory module.

According to a further embodiment, a memory device includes: a first memory cell block including a plurality of sub-blocks, each including a plurality of normal memory cells; a second memory cell block including one or more sub-blocks, each including a plurality of failure recovery memory cells; and an error correction circuit, wherein the memory device is configured to: use memory cells of the second memory cell block for error correction when a one-bit error occurs in a first sub-block, and use memory cells of the second memory cell block for redundancy operations when a multi-bit error occurs in the first sub-block.

In another embodiment, a memory device includes: a first memory cell block including a plurality of sub-blocks, each including a plurality of normal memory cells; a second memory cell block including one or more sub-blocks, each including a plurality of failure recovery memory cells; a control circuit; and an error correction circuit. The control circuit is configured to: receive addresses received from outside the memory device; compare the received addresses to stored addresses; and based on the comparisons, determine for each received address, whether to perform error correction using the second memory cell block or whether to use the second memory cell block for redundancy operations.

BRIEF DESCRIPTION OF THE DRAWINGS

Exemplary embodiments will be more clearly understood from the following detailed description taken in conjunction with the accompanying drawings in which.

DETAILED DESCRIPTION

Figure 1:
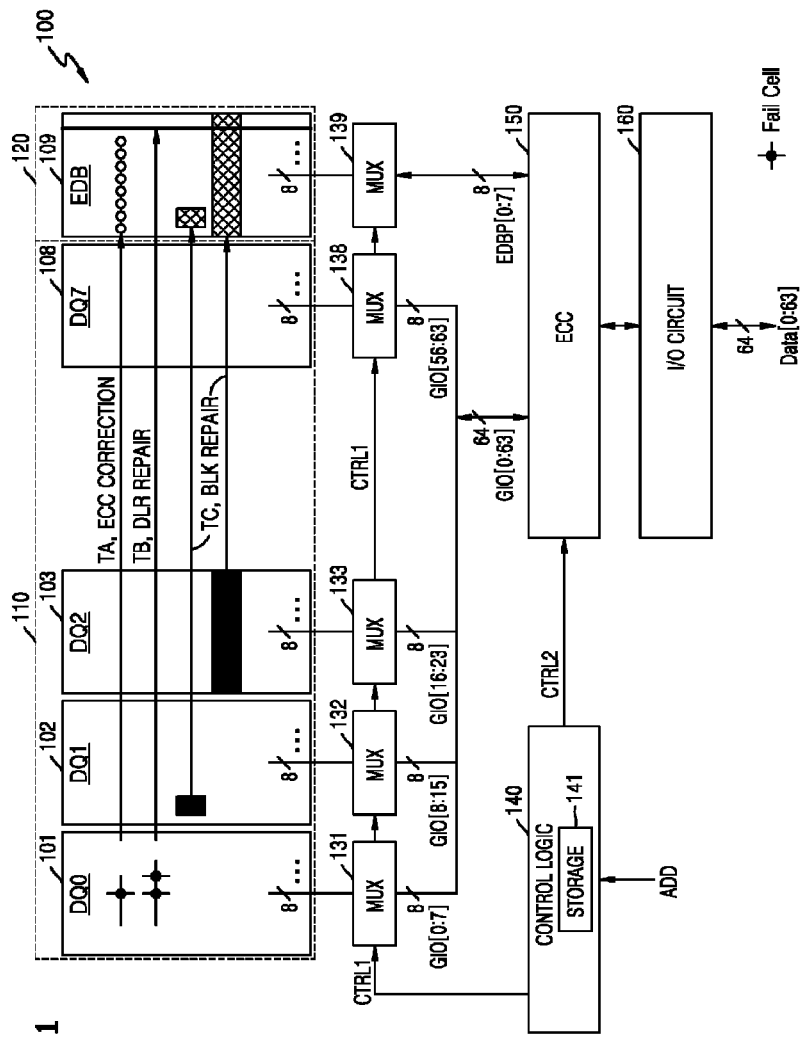
FIG. 1 is a block diagram of a memory device for performing both an error correction coding (ECC) operation and a redundancy repair operation, according to one exemplary embodiment.

The present disclosure now will be described more fully hereinafter with reference to the accompanying drawings, in which exemplary embodiments are shown. This inventive concept may, however, be embodied in many different forms and should not be construed as limited to the embodiments set forth herein. In drawings, like numbers refer to like elements throughout and measurements of elements may be exaggerated for clarity.

The terminology used herein is for the purpose of describing particular embodiments only and is not intended to limit the inventive concept. As used herein, the singular forms 'a', 'an' and 'the' are intended to include the plural forms as well, unless the context clearly indicates otherwise. It will be further understood that the terms 'include' and/or 'comprise' when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items.

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Advancements in semiconductor manufacturing technology have led to an increase in the memory capacity of a semiconductor memory device. As a microfabrication process technology has advanced, the number of defective memory cells has increased. 'Fail' memory cells may include defective cells and weak cells. The defective cells are hardware-defective. That is, the defective cells are memory cells that do not operate due to a defect in a manufacturing process, e.g., memory cells in which a disconnection or short of a wiring occurred. The weak cells are software-defective. That is, the weak cells are memory cells that are defective under a specific voltage condition or specific operation timing. Examples of weak cells may include cells that deteriorate in terms of their characteristics, e.g., a cell having a short refresh duration, a cell having a degraded cell write performance or a variable retention time, etc.

To secure the manufacturing yield, 'fail' memory cells are repaired by replacing them with redundant memory cells. However, a sufficient yield may not be achieved only using a redundancy repair operation. Thus, a method of repairing error bits by applying an error correction code (ECC) operation as well as a redundancy repair operation in dynamic random access memory (DRAM) has been introduced.

The ECC operation provides an ECC function of detecting errors, which may occur during writing/reading of data, and correcting the errors. To provide data integrity, the DRAM may employ an ECC circuit. For example, the ECC circuit may perform the ECC operation using parity bits during detection/correction of errors.

FIG. 1 is a block diagram of an exemplary memory device 100 for performing both an ECC operation and a redundancy repair operation, according to one embodiment.

Referring to FIG. 1, the memory device 100 includes a first memory cell block 110 and a second memory cell block 120. The first memory cell block 110 includes a plurality of main memory cell blocks 101 to 108. The plurality of main memory cell blocks 101 to 108 are memory blocks determining a memory capacity of the memory device 100. The second memory cell block 120 includes a memory cell block 109 for ECC and/or redundancy repair.

In each of the plurality of main memory cell blocks 101 to 108, a plurality of memory cells are arrayed in rows and columns. In the memory cell block 109 for ECC and/or redundancy repair, a plurality of memory cells are arrayed in rows and columns, similar to the plurality of main memory cell blocks 101 to 108.

Since data stored in the plurality of memory cells of the plurality of main memory cell blocks 101 to 108 is input and output via corresponding data input/output (I/O) pads DQ0 to DQ7, the plurality of main memory cell blocks 101 to 108 will be hereinafter referred to as 'DQ0 to DQ7 cell blocks 101 to 108', for convenience of explanation. They may also be referred to herein as normal cell blocks, including normal cells. Also, each of the cell blocks 101 to 108, as well as other blocks that are part of a larger block, may be referred to herein as "sub-blocks." Also, since the memory cell block 109 for ECC and/or redundancy repair is used for ECC, data line repair and block repair to repair 'fail' cells generated in the DQ0 to DQ7 cell blocks 101 to 108, the memory cell block 109 for ECC and/or redundancy repair will be hereinafter referred to as 'EDB cell block 109', for convenience of explanation. It may also be referred to herein as a failure recovery block, including failure recovery cells.

The memory device 100 includes a plurality of first switching units 131 to 138, also referred to herein as switching circuits respectively connected to the DQ0 to DQ7 cell blocks 101 to 108 and a second switching unit 139 connected to the EDB cell block 109. The plurality of first switching units 131 to 138 and the second switching unit 139 operate so that the EDB cell block 109 may be selectively used for ECC, data line repair, and block repair. The plurality of first switching units 131 to 138 and the second switching unit 139 are controlled by a first control signal CTRL1 that is generated by a control logic unit 140, also described herein as a control logic circuit 140, or simply a control circuit. The first control signal CTRL1 controls the plurality of first switching units 131 to 138 and the second switching unit 139 to selectively perform an ECC operation or a redundancy repair operation according to types of 'fail' cells generated in the first memory cell block 110.

The control logic unit 140 includes a fail address storing unit 141 that stores fail addresses addressing 'fail' memory cells in the memory device 100. The 'fail' memory cells may include defective cells and weak cells. The defective cells mean cells that are defective in terms of hardware, such as explained above and the weak cells mean cells that are defective in terms of software, such as explained above.

The fail address storing unit 141 may store fail addresses occurring during testing of the memory device 100. Also, the fail address storing unit 141 may store fail addresses newly occurring while the memory device 100 operates in a system mounted therewith. The fail address storing unit 141 may update fail addresses stored therein to additionally store occurring fail addresses. The fail address storing unit 141 may be implemented, for example, with an antifuse array, a content addressable memory (CAM), a register, or a memory device such as a static random access memory (SRAM).

Fail addresses that are stored in the fail address storing unit 141 may be classified based on types of fails according to error bits included in data that are read from the first memory cell block 110. In the DQ0 to DQ7 cell blocks 101 to 108 of the first memory cell block 110, data may be read from memory cells per one unit. In each of the DQ0 TO DQ7 cell blocks 101 to 108, bit lines corresponding to a burst length (BL) may be simultaneously accessed to support the BL indicating the maximum number of column locations that is accessible. For example, if the BL is set to 8, data bits may be set to 64 bits. In this case, 64-bit data per one unit, which is read from the DQ0 TO DQ7 cell blocks 101 to 108, may be referred to as a 'codeword'.

8 parity bits may be used for an ECC operation for detecting one-bit error with respect to 64 data bits and correcting a detected error. Bits obtained by adding the 64 data bits and the 8 parity bits may be referred to as a 'codeword'. One codeword may include 72 bits, and [72, 64] Hamming codes may be used with respect to one codeword during an ECC operation.

Fails corresponding to fail addresses that are stored in the fail address storing unit 141 may be classified into a type in which the number of error bits in one codeword is one, a type in which the number of error bits in one codeword is two, and a type in which the number of error bits in one codeword is three or more. The type in which the number of error bits in one codeword is three or more may be regarded as a block fail. In one embodiment, when the number of error bits in one codeword is one, the EDB cell block 109 is used for ECC (refer to TA of FIG. 1). When the number of error bits in one codeword is two or more, 'fail' cells may not be able to be repaired by an ECC operation. Thus, in one embodiment, when the number of error bits in one codeword is two, the EDB cell block 109 is used for data line repair (refer to TB of FIG. 1). When the number of error bits in one codeword is three or more, that is, a block fail occurs, the EDB cell block 109 is used for block repair (refer to TC of FIG. 1).

The control logic unit 140 determines whether an address ADD that is applied from the outside is the same as a fail address stored in the fail address storing unit 141. The control logic unit 140 compares fail addresses, which are stored in the fail address storing unit 141 according to types of fail cells, i.e., a single-bit error in one codeword, a two-bit error in one codeword, and a three or more-bit error in one codeword (i.e., a block fail), to the address ADD applied from the outside, and generates first and second control signals CTRL1 and CTRL2 according to the comparison result.

The first and second control signals CTRL1 and CTRL2 are generated according to the types of fail cells corresponding to fail addresses, i.e., the single-bit error in one codeword, the two-bit error in one codeword, and the three or more-bit error in one codeword (i.e., the block fail). The two-bit error and three or more-bit errors are collectively referred to herein as multi-bit errors. The first control signal CTRL1 is provided to the plurality of first switching units 131 to 138 and the second switching unit 139, and the second control signal CTRL2 is provided to an ECC circuit 150. The first and second control signals CTRL1 and CTRL2 control the first and second switching units 131 to 138 and 139 and the ECC circuit 150 to selectively perform an ECC operation or a redundancy repair operation according to types of 'fail' cells occurring in the first memory cell block 110.

The ECC circuit 150 generates parity bits with respect to only a fail memory cell having a single-bit error in one codeword in the first memory cell block 110 in response to the second control signal CTRL2, and performs an ECC operation of detecting and correcting an error bit of a 'fail' memory cell by using the parity bits. Data corrected by the ECC circuit 150 is delivered to an input/output (I/O) circuit 160.

The I/O circuit 160 delivers write data Data[0:63] to the ECC circuit 150 or to first to eighth data lines GIO[0:63] or a ninth data line EDBP[0:7] during a write operation. The I/O circuit 160 outputs read data Data[0:63] corrected by the ECC circuit 150 to the outside during a read operation. Alternatively, the I/O circuit 160 outputs data delivered through the first to eighth data lines GIO[0:63] or the ninth data line EDBP[0:7] to the outside as the read data Data[0:63], during the read operation.

Figure 2:
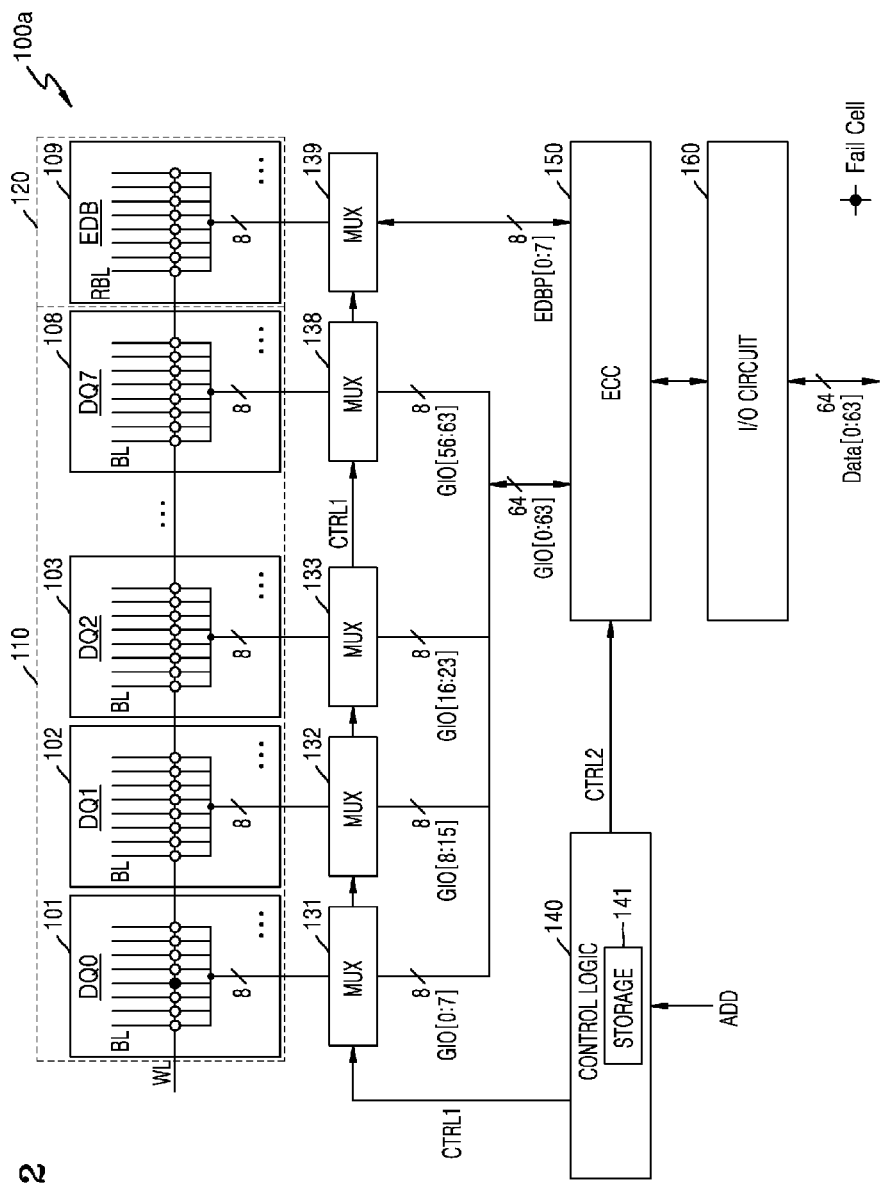
FIGS. 2 to 6 are diagrams for explaining methods of repairing 'fail' cells in the memory device of FIG. 1, according to one exemplary embodiment.
Figure 3:
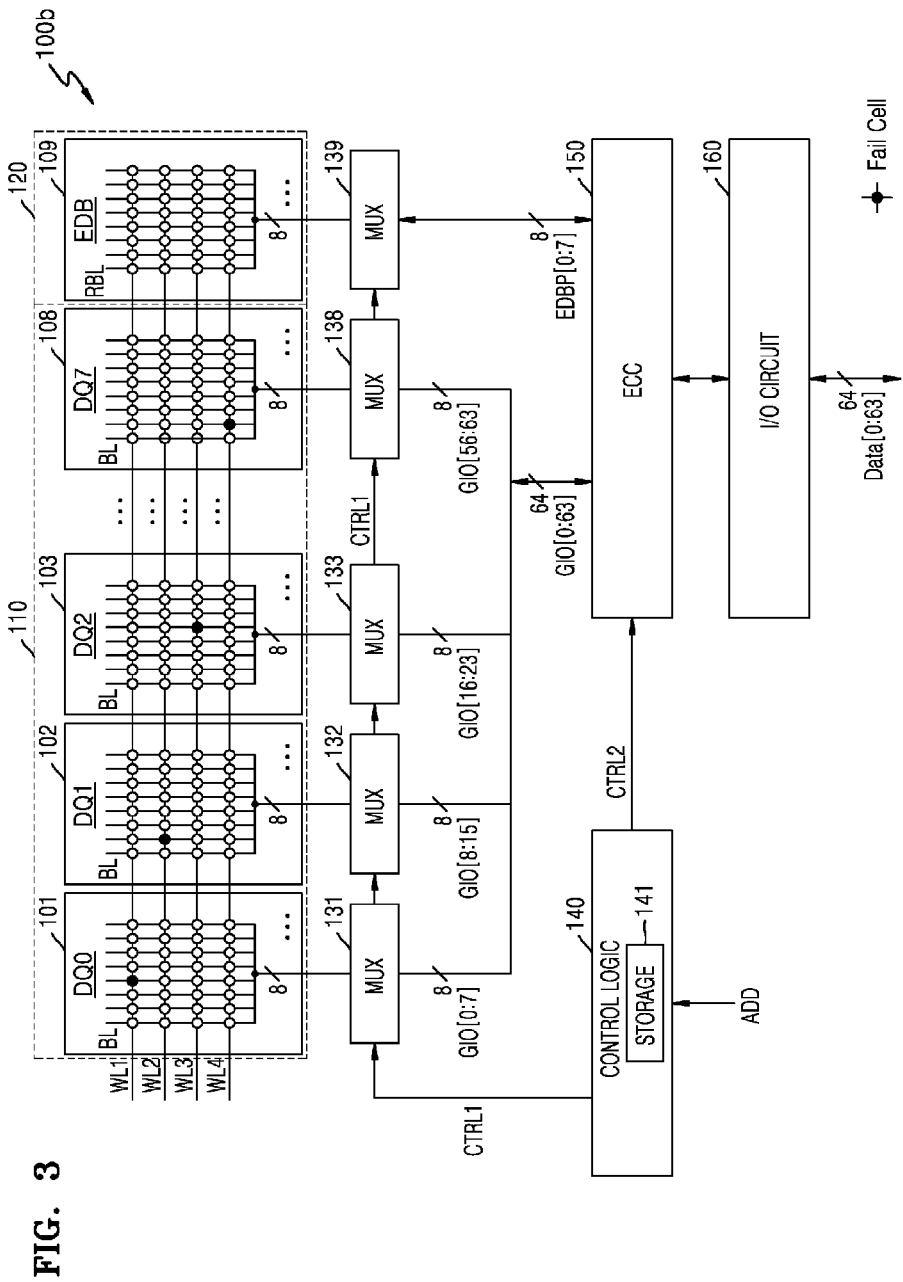
Figure 4:
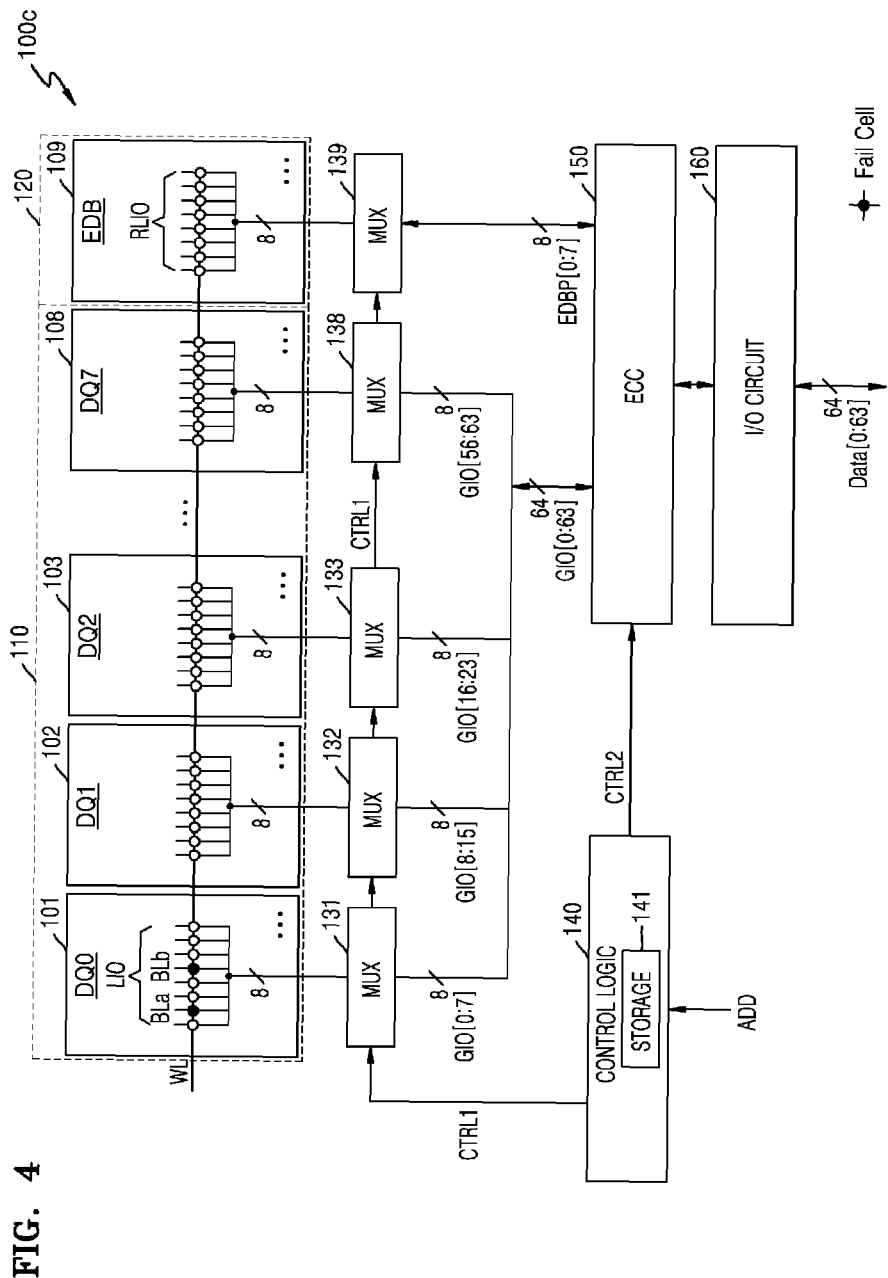
Figure 5:
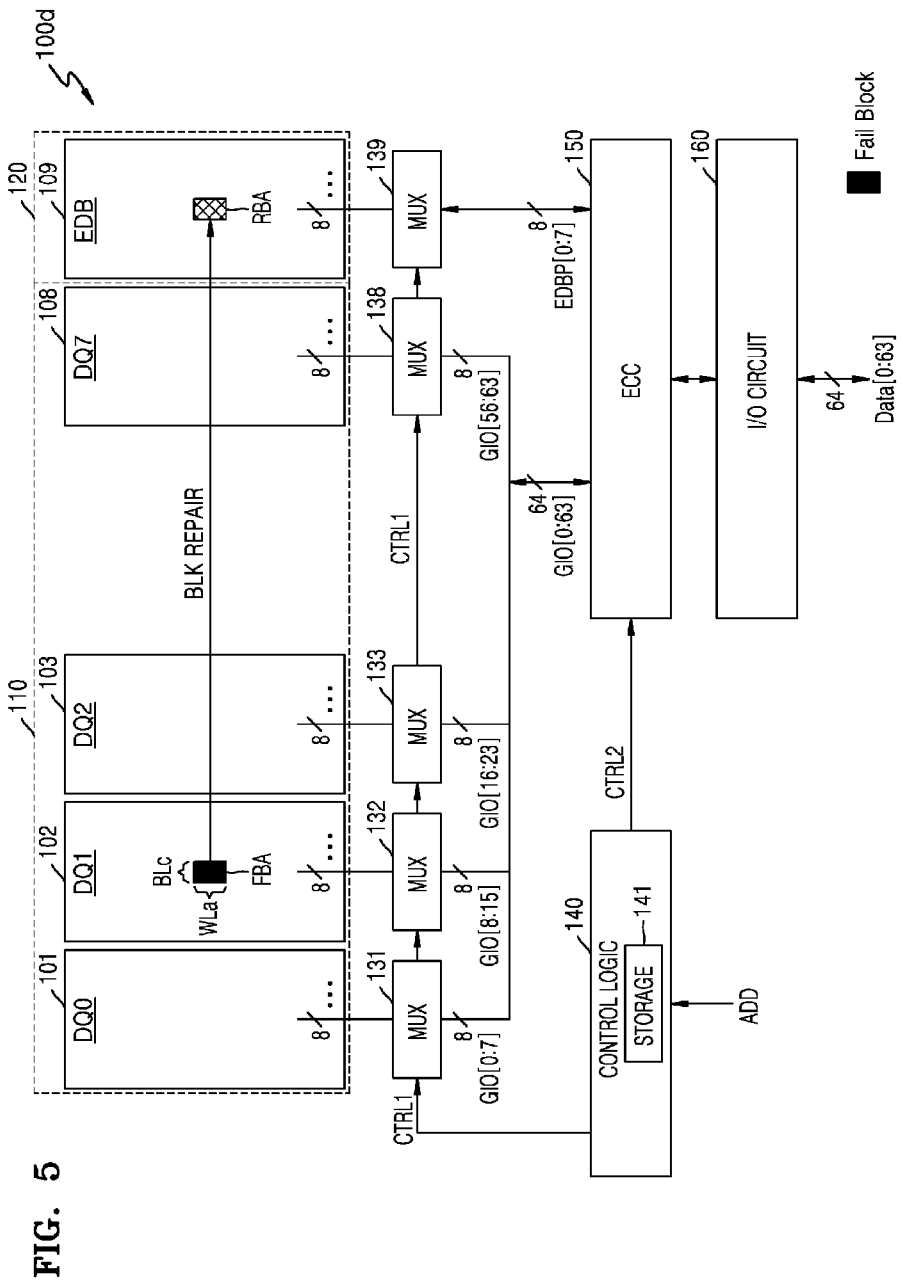
Figure 6:
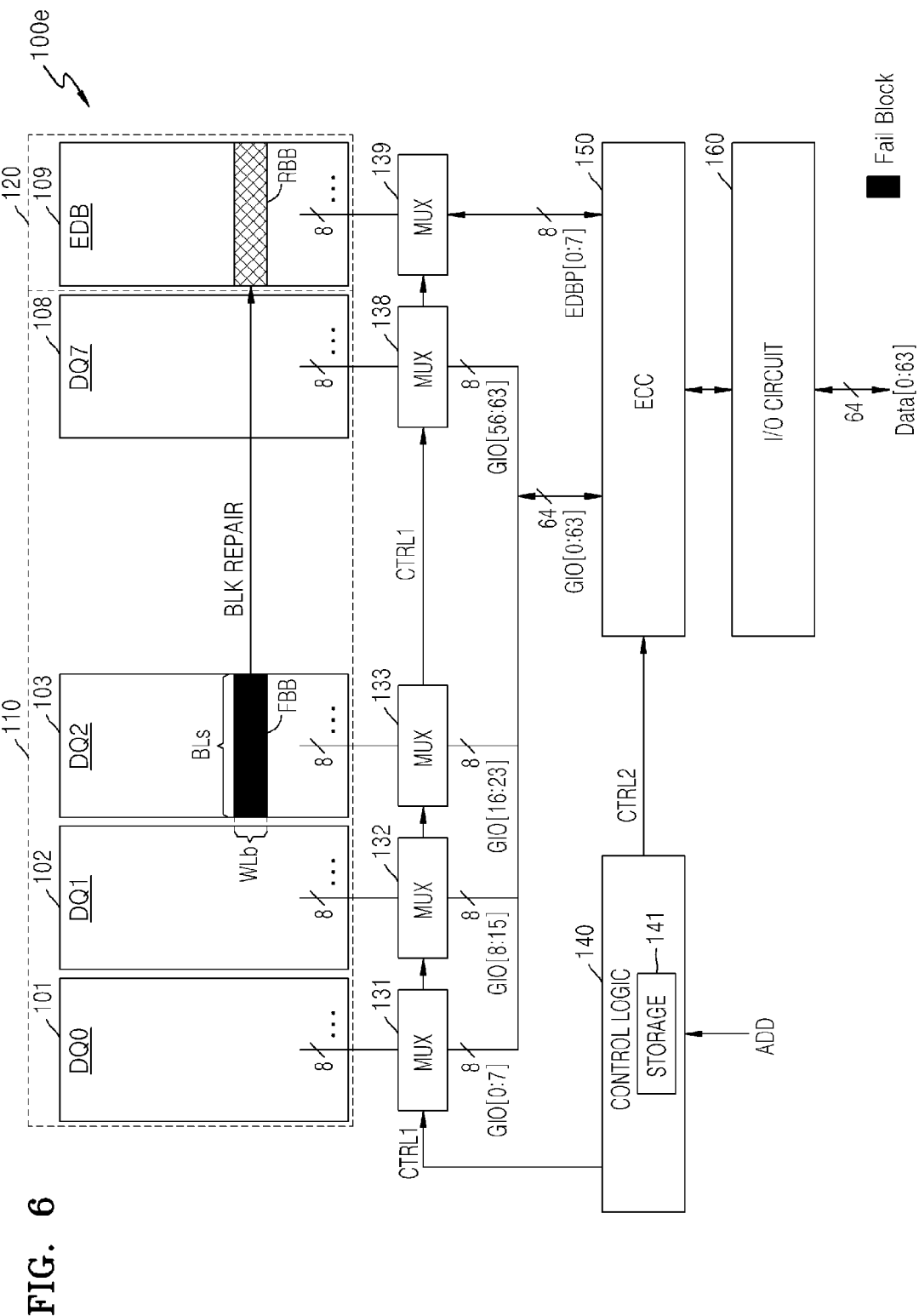

FIGS. 2 to 6 are diagrams for explaining methods of repairing 'fail' cells in the memory device 100 of FIG. 1. FIGS. 2 and 3 are diagrams for explaining methods of repairing a single-bit error in one codeword, FIG. 4 is a diagram for explaining a method of repairing a two-bit error in one codeword, and FIGS. 5 and 6 are diagrams for explaining methods of repairing a block fail.

Referring to FIG. 2, one 'fail' cell exists in a DQ0 cell block 101 of a memory device 100*a* corresponding to the memory device 100, and an EDB cell block 109 is used to detect the 'fail' cell and correct the detected 'fail' cell. In DQ0 to DQ7 cell blocks 101 to 108, rows may be formed, for example, of 8K word lines WL and columns may be formed, for example, of 1 K bit lines BL. Memory cells connected to intersections of the word lines WL and the bit lines BL may be DRAM cells. In the DQ0 to DQ7 cell blocks 101 to 108, the word lines WL are accessed with row addresses, and the bit lines BL are accessed by column addresses.

In one embodiment, the memory device 100*a* may be set such that a burst length is equal to '8'. Thus, the DQ0 cell block 101 is connected to a first data lines GIO[0:7] via a first switching unit 131 to read and write 8-bit data corresponding to a first burst length. The DQ1 cell block 102 is also connected to a second data lines GIO[8:15] via a first switching unit 132 to read and write 8-bit data corresponding to a second burst length. The DQ2 to DQ7 cell blocks 103 to 108 are also respectively connected to third to eighth data lines GIO[16:63] via first switching units 133 to 138 to read and write each 8-bit data corresponding to third to eighth burst lengths, respectively. First, second, third, etc. data lines, as described herein, may also be referred to as a first set of data lines, second set of data lines, third set of data lines, etc.

In the memory device 100*a*, a plurality of pieces of data Data[0:63] that are to be written to the DQ0 to DQ7 cell blocks 101 to 108 are delivered to the first to eighth data lines GIO[0:63] via the I/O circuit 160. First to eighth burst data that are to be respectively written to the DQ0 to DQ7 cell blocks 101 to 108, i.e., a total of 64 bits of data Data[0:63], are received via the first to eighth data lines GIO[0:63], respectively. The received 64-bit data Data[0:63] is written to eight memory cells of each of the DQ0 to DQ7 cell blocks 101 to 108 selected by the first switching units 131 to 138 from among the plurality of memory cells connected to the word lines WL.

When one 'fail' cell is present among memory cells that are connected to one word line WL in the DQ0 to DQ7 cell blocks 101 to 108 and correspond to one codeword, the EDB cell block 109 is used to repair the 'fail' cell. That is, the EDB cell block 109 repairs a single-bit error in the codeword. For example, one 'fail' cell (indicated with '●') may be present in the DQ0 cell block 101 among memory cells of the DQ0 to DQ7 cell blocks 101 to 108, which are selected by the word lines WL and the first switching unit 131.

However, the inventive concept is not limited thereto, and the 'fail' cell (indicated with '●') may be present in memory cells of the DQ1 to DQ7 cell blocks 102 to 108. The EDB cell block 109 is controlled by a control logic unit 140 and an ECC circuit 150, and is used to detect and correct a 'fail' cell in any of the DQ0 to DQ7 cell blocks 101 to 108.

The EDB cell block 109 may include, for example, 8K word lines WL and 1 K bit lines RBL, similar to each of the DQ0 to DQ7 cell blocks 101 to 108. In one embodiment, memory cells connected to intersections of the word lines WL and the bit lines RBL in the EDB cell block 109 are also DRAM cells.

In the EDB cell block 109, eight bit lines RBLs are connected to ninth data lines EDBP[0:7] via a second switching unit 139. Parity bits regarding one codeword that is data Data[0:63] stored in 'fail' cells of any of the DQ0 to DQ7 cell blocks 101 to 108 are delivered to the ninth data lines EDBP[0:7]. The parity bits are stored in and read from eight memory cells of the EDB block 109 via the ninth data lines EDBP[0:7]. In this case, the eight memory cells of the EDB cell block 109 are connected to a word line WL to which the 'fail' cells are also connected.

The control logic unit 140 compares an address ADD applied from the outside with fail cell addresses stored in the fail address storing unit 141. When, as a comparison result, a matched fail cell address corresponds to a type of single-bit error in one codeword, the control logic unit 140 generates the first control signal CTRL1 and provides the generated first control signal CTRL1 to the first and second switching units 131 to 138 and 139, and generates the second control signal CTRL2 and provides the generated second control signal CTRL2 to the ECC circuit 150.

The first switching units 131 to 138 connect the DQ0 to DQ7 cell blocks 101 to 108 to the first to eight data lines GIO[0:63] in response to the first control signal CTRL1. The second switching unit 139 connects the EDB cell block 109 to the ninth data lines EDBP[0:7] in response to the first control signal CTRL1. The ECC circuit 150 performs ECC decoding and encoding operations in response to the second control signal CTRL2.

The ECC circuit 150 detects and corrects a 'fail' cell in the DQ0 to DQ7 cell blocks 101 to 108 in response to the second control signal CTRL2. During the write operation, the ECC circuit 150 generates parity bits regarding write data Data[0:63] received from the outside in response to the second control signal CTRL2 and delivers the parity bits to the ninth data lines EDBP[0:7]. The parity bits delivered to the ninth data lines EDBP[0:7] are stored in memory cells of the EDB cell block 109, which are connected to the word line WL to which the 'fail' cell is connected. This operation corresponds to an ECC encoding operation.

During the read operation, the ECC circuit 150 receives, in response to the second control signal CTRL2, data delivered via the first to eighth data lines GIO[0:63] and data delivered via the ninth data lines EDBP[0:7]. The data delivered via the first to eighth data lines GIO[0:63] is data stored in the memory cells of the DQ0 to DQ7 cell blocks

101 to 108, which are connected to the word line WL to which the 'fail' cell is connected. The data delivered via the ninth data lines EDBP[0:7] is parity bits stored in the memory cells of the EDB cell block 109, which are connected to the word line WL connected to the 'fail' cell.

The ECC circuit 150 generates syndrome data, calculates the location of the 'fail' cell, i.e., the location of an error bit, corrects data corresponding to the location of the error bit, and then outputs error-corrected data Data[0:63], all based on the data delivered via the first to eighth data lines GIO[0:63] and the ninth data lines EDBP[0:7]. This operation corresponds to an ECC decoding operation. The error-corrected data Data[0:63] is output to the outside of the memory device 100*a* via the I/O circuit 160.

The current embodiment of FIG. 2 illustrates a case in which when one 'fail' cell (indicated with '●') is present in the DQ0 cell block 101 among memory cells of the DQ0 to DQ7 cell blocks 101 to 108, which are selected by a word line WL and the first switching units 131 to 138, parity bits regarding data Data[0:63] to be written to the memory cells including the 'fail' cell are generated and stored in memory cells of the ECC cell block 109, which are connected to this word line WL. A 'fail' cell may occur in memory cells connected to other word lines WL among the memory cells of the DQ0 to DQ7 cell blocks 101 to 108, which are selected by the first switching units 131 to 138. In this case, as illustrated in FIG. 3, a memory device 100*b* detects and corrects a plurality of single-bit errors in DQ0 to DQ7 cell blocks 101 to 108.

In the memory device 100*b* of FIG. 3, when one 'fail' cell (indicated with '●') is present in the DQ0 cell block 101 among memory cells of the DQ0 to DQ7 cell blocks 101 to 108, which are selected by a first word line WL1 and first switching units 131 to 138, parity bits regarding data Data[0:63] that is to be written to memory cells including the 'fail' cell are stored in memory cells of an EDB cell block 109, which are connected to the first word line WL1. In the memory device 100*b*, when one 'fail' cell (indicated with '●') is present in the DQ1 cell block 102 among memory cells of the DQ0 to DQ7 cell blocks 101 to 108, which are selected by a second word line WL2 and the first switching units 131 to 138, parity bits regarding data Data[0:63] that is to be written to memory cells including the 'fail' cell are stored in memory cells of the EDB cell block 109, which are connected to the second word line WL2. Similarly, in the memory device 100*b*, when a 'fail' cell (indicated with '●') is present in each of the DQ2 and DQ7 cell blocks 103 and 108 among memory cells of the DQ0 to DQ7 cell blocks 101 to 108, which are selected by one of third and fourth word lines WL3 and WL4 and the first switching units 131 to 138, parity bits regarding data Data[0:63] to be written to memory cells including the 'fail' cells are stored in memory cells of the EDB cell block 109, which are connected to the third and fourth word lines WL3 and WL4, respectively.

During a write operation, the memory device 100*b* generates parity bits regarding codeword stored in memory cells that are respectively connected to the first to fourth word lines WL1 to WL4 of 'fail' cells in the DQ0 to DQ7 cell blocks 101 to 108, and stores the parity bits regarding the codeword in memory cells of the EDB cell block 109, which are respectively connected to the first to fourth word lines WL1 to WL4.

During a read operation, the memory device 100*b* detects and corrects error bits in 'fail' cells in the DQ0 to DQ7 cell blocks 101 to 108, based on a codeword delivered to the first to eighth data lines GIO[0:63] after being read from the memory cells that are respectively connected to the first to fourth word lines WL1 to WL4 and parity bit data delivered to the ninth data lines EDBP[0:7] from memory cells of the EDB cell block 109, which are respectively connected to the first to fourth word lines WL1 to WL4.

Referring to FIG. 4, a memory device 100*c* may include a two-bit error in one codeword. Two 'fail' cells may be present among memory cells that are connected to one word line WL in DQ0 to DQ7 cell blocks 101 to 108 and correspond to one codeword. For example, in the DQ0 cell block 101, a memory cell, which is connected to an intersection of the word line WL and a bit line BLa, and a memory cell, which is connected to an intersection of the word line WL and a bit line BLb, may be 'fail' cells (indicated with '●'). This is a case in which a two-bit error occurs in bit lines corresponding to a first burst length from among one codeword. For convenience of explanation, bit lines corresponding to a burst length in each of the DQ0 to DQ7 cell blocks 101 to 108 will be hereinafter referred to as 'local data lines (LIOs)'.

A control logic unit 140 compares an address ADD applied from the outside with a fail cell address stored in a fail address storing unit 141. When the fail cell address corresponds to a type of two-bit error in one codeword as a comparison result, the control logic unit 140 may generate a first control signal CTRL1 for replacing local data lines LIOs, which are accessed by the fail cell address, with local data lines RLIOs of an EDB cell block 109. The first control signal CTRL1 is provided to first switching units 131 to 138 and a second switching unit 139.

The first switching unit 131 disconnects local data lines LIOs of the DQ0 cell block 101 from first data lines GIO[0:7] in response to the first control signal CTRL1 (e.g., the first control signal CTRL1 having a particular value indicating a two-bit error). In response to the first control signal CTRL1, the second switching unit 139 selects the local data lines RLIOs of the EDB cell block 109 instead of the local data lines LIOs of the DQ0 cell block 101 to connect the local data lines RLIOs of the EDB cell block 109 to ninth data lines EDBP[0:7].

During a write operation, the memory device 100*c* delivers data Data[0:7] to be delivered to the DQ0 cell block 101 from among write data Data[0:63], which are received via an I/O circuit 160 from the outside, to the ninth data lines EDBP[0:7]. Data Data[8:63] to be delivered to the DQ1 to DQ7 cell blocks 102 to 108 from among the write data Data[0:63] are stored in memory cells of the DQ1 to DQ7 cell blocks 102 to 108, which are connected to the word line WL, via second to eighth data lines GIO[8:63] and the first switching units 132 to 138.

During a read operation, the memory device 100*c* delivers data read from the DQ1 to DQ7 cell blocks 102 to 108 to the second to eighth data lines GIO[8:63] via the first switching units 132 to 138, and delivers data read from the EDB cell block 109 to the ninth data line EDBP[0:7] via the second switching unit 139. The read data delivered to the second to eighth data lines GIO[8:63] and the ninth data line EDBP[0:7] is output through the I/O circuit 160. Though an example of two fail cells in one cell block 101 is shown, the two fail cells of the word line may be in different cell blocks.

Referring to FIG. 5, a memory device 100*d* may include a block fail in which a portion FBA (hereinafter, referred to as 'first fail block') of a DQ1 cell block 102 is failed. The first fail block FBA represents a cell block in which memory cells connected to intersections of some word lines WLa and some bit lines BLc in the DQ1 cell block 102 are 'fail' cells. For example, at least two fail cells in the block are connected to different respective word lines.

A control logic unit 140 compares an address ADD applied from the outside with a fail cell address stored in a fail address storing unit 141. When, as a comparison result, the fail cell address corresponds to a type of block fail, the control logic unit 140 may generates a first control signal CTRL1 for replacing the first fail block FBA in the DQ1 cell block 102, which is accessed by the fail cell address, with a first repair block RBA in an EDB cell block 109.

A first switching unit 132 disconnects the first fail block FBA in the DQ1 cell block 102 from second data lines GIO[8:15] in response to the first control signal CTRL1. A second switching unit 139 selects the first repair block RBA of the EDB cell block 109 instead of the first fail block FBA of the DQ1 cell block 102 and connects the first repair block RBA of the EDB cell block 109 to ninth data lines EDBP[0:7], in response to the first control signal CTRL1.

During a write operation, the memory device 100d delivers data Data[8:15] to be delivered to the first fail block FBA of the DQ1 cell block 102 from among write data Data[0:63], which are received via an I/O circuit 160 from the outside, to the ninth data lines EDBP[0:7]. Data Data[0:7] and data Data[16:63] to be delivered to DQ0 and DQ2 to DQ7 cell blocks 101 and 103 to 108 from among the write data Data[0:63] are stored in memory cells of the DQ0 and DQ2 to DQ7 cell blocks 101 and 103 to 108 via first and third to eighth data lines GIO[0:7] and GIO[16:63] and first switching units 131 and 133 to 138.

During a read operation, the memory device 100d delivers data read from the DQ0 and DQ2 to DQ7 cell blocks 101 and 103 to 108 to the first and third to eighth data lines GIO[0:7] and GIO[16:63] via the first switching units 131 and 133 to 138, and delivers data read from the first repair block RBA of the EDB cell block 109 to the ninth data line EDBP[0:7] via the second switching unit 139. The read data delivered to the first and third to eighth data lines GIO[0:7] and GIO[16:63] and the ninth data line EDBP[0:7] is output through the I/O circuit 160.

Referring to FIG. 6, a memory device 100e may include a block fail in which memory cells connected to predetermined word lines WLb in a DQ2 cell block 103 are 'fail' cells. A second fail block FBB represents a cell block in which most of the memory cells connected to intersections of the predetermined word lines WLb and predetermined bit lines BLs in the DQ2 cell block 103 are 'fail' cells.

A control logic unit 140 compares an address ADD applied from the outside with a fail cell address stored in a fail address storing unit 141. When, as a comparison result, the fail cell address corresponds to a type of block fail, the control logic unit 140 may generate a first control signal CTRL1 (e.g., the CTRL1 signal having a value indicating a block fail) for replacing the second fail block FBB in the DQ2 cell block 103, which is accessed by the fail cell address, with a second repair block RBB in an EDB cell block 109.

A first switching unit 133 disconnects the second fail block FBB in the DQ2 cell block 103 from third data lines GIO[16:23] in response to the first control signal CTRL1. A second switching unit 139 selects the second repair block RBB of the EDB cell block 109 instead of the second fail block FBB of the DQ2 cell block 103 and connects the second repair block RBB of the EDB cell block 109 to ninth data lines EDBP[0:7], in response to the first control signal CTRL1.

During a write operation, the memory device 100e delivers data Data[16:23] to be delivered to the second fail block FBB of the DQ2 cell block 103 from among write data Data[0:63], which are received via an I/O circuit 160 from the outside, to the ninth data lines EDBP[0:7]. Data Data[0:15] and data Data[24:63] to be delivered to DQ0 to DQ1 and DQ3 to DQ7 cell blocks 101 to 102 and 104 to 108 from among the write data Data[0:63] are stored memory cells of the DQ0 to DQ1 and DQ3 to DQ7 cell blocks 101 to 102 and 104 to 108 via first to second and fourth to eighth data lines GIO[0:15] and GIO[24:63] and first switching units 131, 132, and 134 to 138. The data [16:23] delivered to the ninth data lines EDBP[0:7] is stored in memory cells of the second repair block RBB of the EDB cell block 109.

During a read operation, the memory device 100e delivers data read from the DQ0 to DQ1 and DQ3 to DQ7 cell blocks 101 to 102 and 104 to 108 to the first to second and fourth to eighth data lines GIO[0:15] and GIO[24:63] via the first switching units 131, 132, and 134 to 138, and delivers data read from the second repair block RBB of the EDB cell block 109 to the ninth data line EDBP[0:7] via the second switching unit 139. The read data delivered to the first to second and fourth to eighth data lines GIO[0:15] and GIO[24:63] and the ninth data lines EDBP[0:7] is output through the I/O circuit 160.

Figure 7:
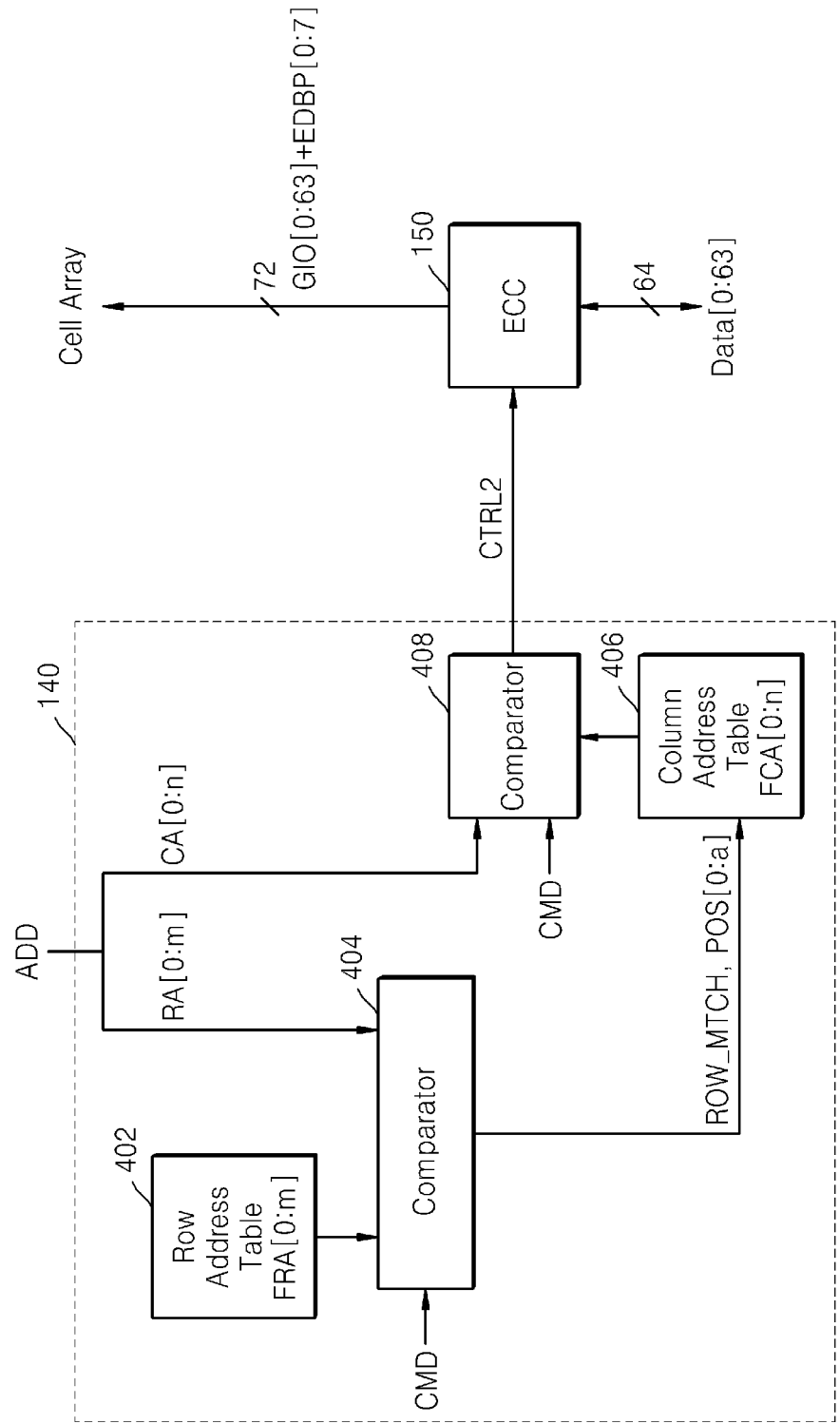
FIG. 7 is a diagram illustrating a control logic unit of FIG. 1, according to one exemplary embodiment.

FIG. 7 is a diagram illustrating the control logic unit 140 of FIG. 1, according to one exemplary embodiment.

Referring to FIG. 7, the control logic unit 140 includes a row address storing unit 402, a first comparator 404, a column address storing unit 406, and a second comparator 408. The row address storing unit 402 stores a row address table including a row address FRA[0:m] of a 'fail' cell, and the column address storing unit 406 stores a column address table including a column address FCA[0:n] of the 'fail' cell. Each table may store more than one row or column address.

The first comparator 404 receives a command CMD instructing a read or write operation and a row address RA[0:m] of an address ADD accessed together with the command CMD, from a memory controller. The first comparator 404 compares the row address FRA[0:m] of the 'fail' cell stored in the row address storing unit 402 with the row address RA[0:m] of the accessed address ADD. The first comparator 404 generates a row match signal ROW_MTCH and a column address position signal POS[0:a] regarding the 'fail' cell as a result of the comparing, and delivers them to the column address storing unit 406.

The column address storing unit 406 provides the column address FCA[0:n] of the 'fail' cell corresponding to the column address position signal POS[0:a] to the second comparator 408, in response to the row match signal ROW_MTCH. The second comparator 408 receives a column address CA[0:n] of the address ADD accessed together with the command CMD, and compares the column address FCA[0:n] of the 'fail' cell provided from the column address storing unit 406 with the column address CA[0:n] of the accessed address ADD. The second comparator 408 generates a second control signal CTRL2 as a result of the comparing, and provides the second control signal CTRL2 to the ECC circuit 150.

During a write operation, the ECC circuit 150 generates parity bits regarding write data Data[0:63] and stores the write data Data[0:63] and the parity bits to a cell array block including the DQ0 to DQ7 cell blocks 101 to 108 and the EDB cell block 109 via first to eighth data lines GIO[0:63] and parity data lines EDBP[0:7], according to the second control signal CTRL2. During a read operation, the ECC circuit 150 generates syndrome data from data delivered to the first to eighth data lines GIO[0:63] and the parity data lines EDBP[0:7] from the cell array block including the DQ0 to DQ7 cell blocks 101 to 108 and the EDB cell block 109, calculates the location of a 'fail' cell, i.e., the location of an error bit, corrects data corresponding to the location of the error bit, and then outputs error-corrected data Data[0:63], all according to the second control signal CTRL2.

Figure 8:
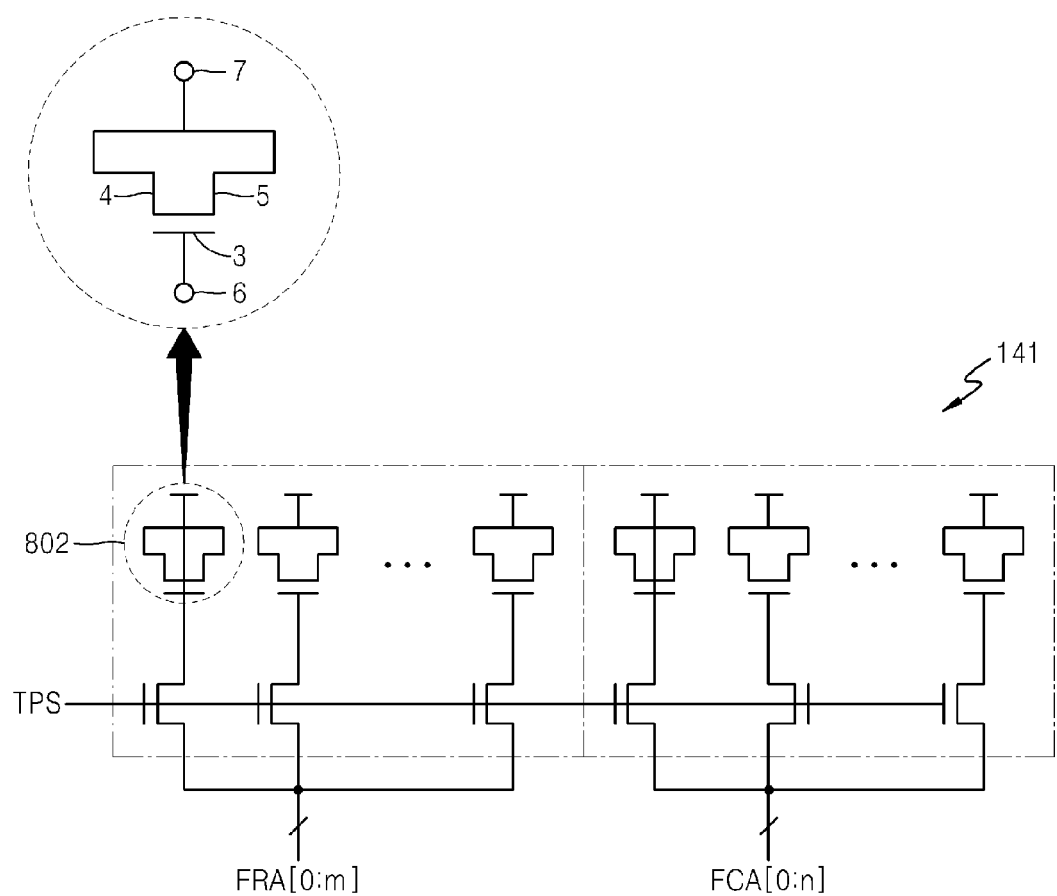
FIG. 8 is a diagram illustrating a fail address storing unit of FIG. 1, according to one exemplary embodiment.

FIG. 8 is a diagram illustrating the fail address storing unit 141 of FIG. 1, according to one exemplary embodiment. Referring to FIG. 8, the fail address storing unit 141 may be embodied as an anti-fuse array including a plurality of anti-fuses 802. The anti-fuses 802 have electrical characteristics opposite to those of fuse elements, and are resistive fuse elements having a high resistance value when they are not programmed and having a low resistance value when they are programmed.

In general, the anti-fuses 802 each have a structure in which a dielectric is inserted between conductors. Each of the anti-fuses 802 is programmed by applying a high voltage via the conductors disposed at both ends thereof to destroy the dielectric between the conductors. By programming the anti-fuses 802, the conductors disposed at both ends in each of the anti-fuses 802 are short-circuited, thereby causing the anti-fuses 802 to have a low resistance value.

Each of the anti-fuses 802 includes a depletion type MOS transistor in which a source 4 and a drain 5 are connected to each other. At an initial stage, a resistance value between a first node 6 connected to a gate electrode 3 and a second node 7 that is commonly connected to the source 4 and the drain 5 is very high since the first node 6 and the second node 7 are separated by a gate oxide film. Thus, no current flows between the first node 6 and the second node 7. For example, this state may be set to be logic 'low' that means a non-programmed state.

The anti-fuses 802 may be irreversibly changed from an 'off' state to an 'on' state by applying a break-down voltage between the first node 6 and the second node 7 to destroy the gate oxide film. When the gate oxide film is destroyed, the resistance value between the first node 6 and the second node 7 is lowered. This state may be set to be logic 'high' that means a programmed state.

In the fail address storing unit 141, a row address FRA [0:m] and a column address CA[0:n] of a 'fail' cell included in the DQ0 to DQ7 cell blocks 101 to 108 of FIG. 1 may be stored by selectively programming the anti-fuses 802. According to a pointer signal TPS, the fail address storing unit 141 provides the row address FRA[0:m] of the 'fail' cell to the first comparator 404 of FIG. 7 and provides the column address FCA[0:n] of the 'fail' cell to the second comparator 408 of FIG. 7.

Figure 9:
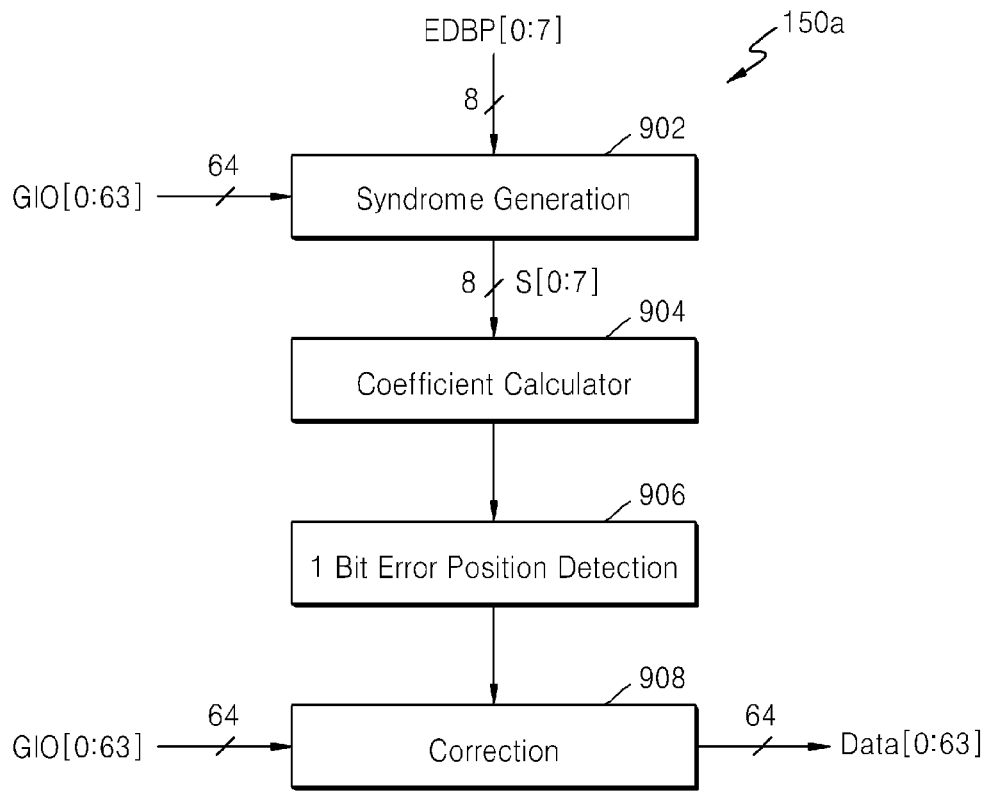
FIG. 9 is a block diagram of an ECC circuit according to one exemplary embodiment.

FIG. 9 is a block diagram of an ECC circuit 150a according to one exemplary embodiment. Referring to FIG. 9, the ECC circuit 150a performs an ECC decoding operation of correcting error bit data, based on data read from memory cells including a 'fail' cell in the DQ0 to DQ7 cell blocks 101 to 108 of FIG. 1 via first to eighth data lines GIO[0:63] and parity bits delivered to parity data lines EDBP[0:7], and outputting error-corrected data Data[0:63]. The ECC circuit 150a includes a syndrome generation unit 902, a coefficient calculator 904, a 1-bit error position detection unit 906, and an error correction unit 908.

The syndrome generation unit 902 receives 64-bit read data via the first to eighth data lines GIO[0:63], receives parity bits via the parity data lines ECCP[0:7], and performs an XOR array operation to generate syndrome data S[0:7]. The coefficient calculator 904 calculates coefficients of an error location equation, based on the syndrome data S[0:7]. At the same time, the 1-bit error position detection unit 906 calculates the location of a 1-bit error, based on the syndrome data S[0:7]. The error location equation is an equation in which the reciprocal of an error bit is used as a root. The error correction unit 908 determines the location of the 1-bit error based on the location of the 1-bit error calculated by the 1-bit error position detection unit 906. The error correction unit 908 corrects an error by inverting a logic value of an error bit in 64-bit data, based on the determined location of the 1-bit error, and outputs error-corrected data Data[0:63].

Figure 10:
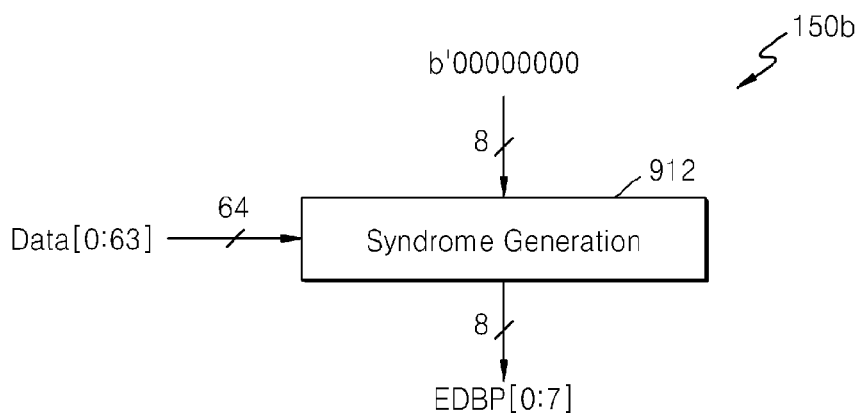
FIG. 10 is a block diagram of an ECC circuit according to another exemplary embodiment.

FIG. 10 is a block diagram of an ECC circuit 150b according to another exemplary embodiment. Referring to FIG. 10, the ECC circuit 150b performs an ECC encoding operation of generating parity bits regarding 64-bit write data Data[0:63] to be written to memory cells including a 'fail' cell in the DQ0 to DQ7 cell blocks 101 to 108. The ECC circuit 18b includes a syndrome generation unit 912 that receives the 64-bit write data Data[0:63] and bits b'00000000 and generates parity bits by performing an XOR array operation thereon. The bits b'00000000 are used to generate parity bits regarding the 64-bit write data Data[0:63]. However, other particular bits may be used to generate parity bits regarding the 64-bit write data Data[0:63], instead of the bits b'00000000. The parity bits are delivered to parity data lines EDBP[0:7].

As described above, the ECC circuit 150a of FIG. 9 or the ECC circuit 150b of FIG. 10 performs an ECC operation using [72, 64] Hamming codes with respect to 64 data bits. The ECC circuit 150a of FIG. 9 or the ECC circuit 150b of FIG. 10 may be also applied to ECC operations using [72, 64] Hamming codes, [12, 8] Hamming codes, and [7, 4] Hamming codes, which will be described with reference to FIGS. 12 to 14 below.

Figure 11:
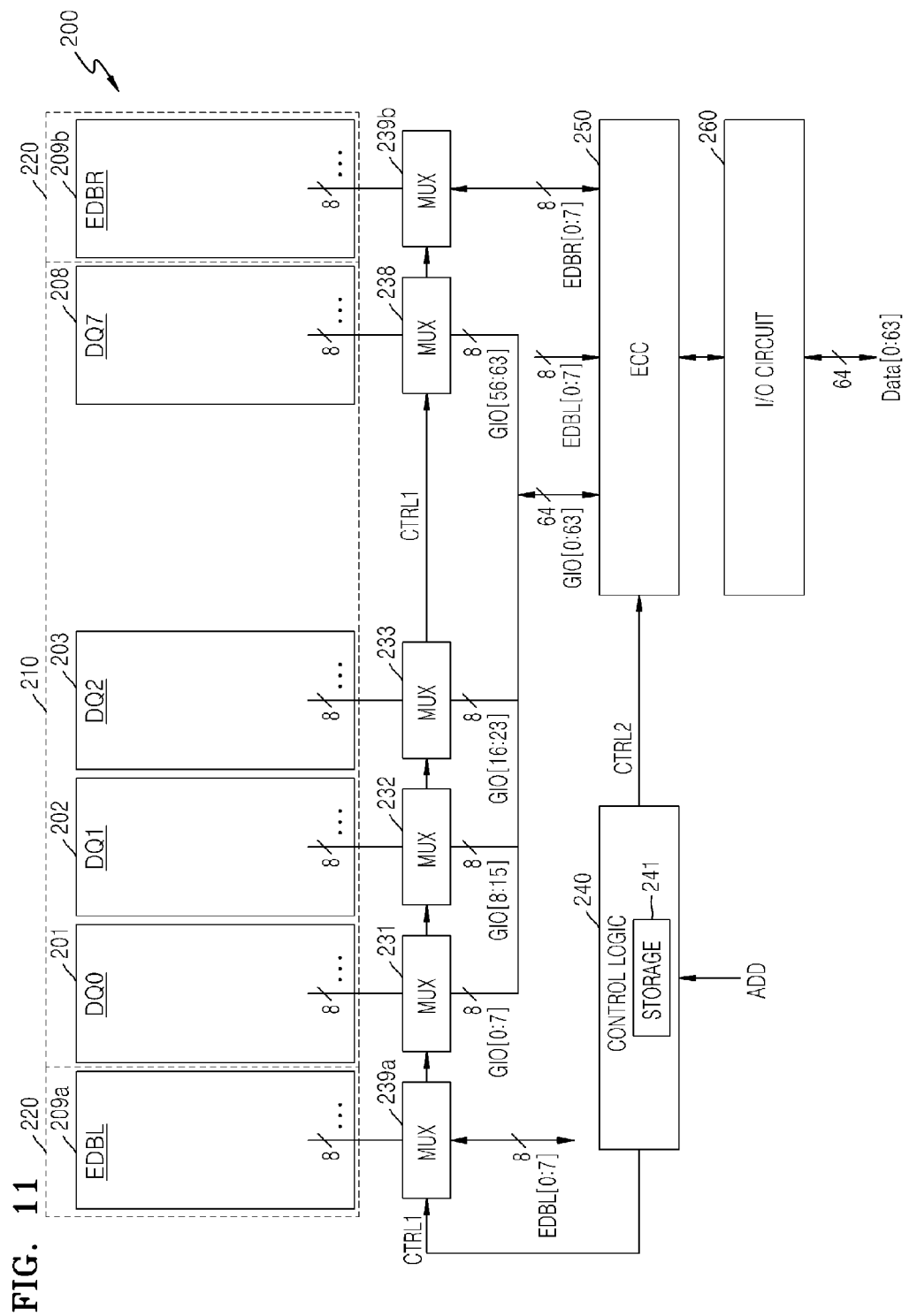
FIG. 11 is a block diagram of a memory device for performing an ECC operation and a redundancy repair operation, according to another exemplary embodiment.

FIG. 11 is a block diagram of a memory device 200 for performing an ECC operation and a redundancy repair operation, according to another exemplary embodiment.

Referring to FIG. 11, in the memory device 200, first and second EDB cell blocks 209a and 209b are disposed at both sides of DQ0 to DQ7 cell blocks 201 to 208, unlike the memory device 100 of FIG. 1. The first EDB cell block 209a is disposed to be adjacent to the DQ0 cell block 201, and the second EDB cell block 209b is disposed to be adjacent to the DQ7 cell block 208.

The memory device 200 includes a first memory cell block 210 and a second memory cell block 220. The first memory cell block 210 is a memory block determining a memory capacity of the memory device 200, and includes the DQ0 to DQ7 cell blocks 201 to 208. The second memory cell block 220 includes the first and second EDB cell blocks 209a and 209b, which are used for ECC, data line repair, and block repair, to repair 'fail' cells occurring in the DQ0 to DQ7 cell blocks 201 to 208.

The memory device 200 includes a plurality of first switching units 231 to 238 respectively connected to the DQ0 to DQ7 cell blocks 201 to 208 and two second switching units 239a and 239b respectively connected to the first and second EDB cell blocks 209a and 209b. The DQ0 to DQ7 cell blocks 201 to 208 are connected to first to eighth data lines GIO[0:63] through the plurality of first switching units 231 to 238, respectively. The first and second EDB cell blocks 209a and 209b are connected to ninth and tenth data lines EDBL[0:7] and EDBR[0:7] through the second switching units 239a and 239b, respectively.

The plurality of first switching units 231 to 238 and the second switching units 239a and 239b operate so that the first and second EDB cell blocks 209a and 209b may be selectively used for ECC, data line repair, and block repair. The plurality of first switching units 231 to 238 and the second switching units 239a and 239b are controlled by a first control signal CTRL1 that is generated by a control logic unit 240. The first control signal CTRL1 controls the plurality of first switching units 231 to 238 and the second switching units 239a and 239b to selectively perform an ECC operation or a redundancy repair operation according to types of 'fail' cells generated in the first memory cell block 210.

The control logic unit 240 includes a fail address storing unit 241 that stores fail addresses of 'fail' memory cells in the memory device 200. The fail address storing unit 241 may store fail addresses occurring, for example, during testing of the memory device 200. Also, the fail address storing unit 241 may store fail addresses newly occurring while the memory device 200 operates in a system mounted therewith. The fail address storing unit 241 may update fail addresses stored therein to store additionally occurring fail addresses. The fail address storing unit 241 may include, for example, an antifuse array, a content addressable memory (CAM), a register, or a memory device such as a static random access memory (SRAM).

The control logic unit 240 determines whether an address ADD that is applied from the outside is the same as a fail address stored in the fail address storing unit 241, and generates the first control signal CTRL1 and a second control signal CTRL2. The first and second control signals CTRL1 and CTRL2 control the first and second switching units 231 to 238 and 239a and 239b and an ECC circuit 250 to select an ECC operation or a redundancy repair operation according to types of 'fail' cells occurring in the first memory cell block 210.

The ECC circuit 250 may change the size of one codeword in the first memory cell block 210 in response to the second control signal CTRL2. One codeword may include, for example, [72, 64] codes that are formed of 64 data bits and 7 parity bits, [12, 8] codes that are formed of 8 data bits and 4 parity bits, or [7, 4] codes that are formed of 4 data bits and 3 parity bits. The ECC circuit 250 performs an ECC operation of detecting and correcting an error bit of a 'fail' memory cell by using the changed size of one codeword. Data corrected by the ECC circuit 250 is delivered to an input/output (I/O) circuit 260.

The I/O circuit 260 delivers write data Data[0:63] to the ECC circuit 250 or to the first to eighth data lines GIO[0:63] or ninth and tenth data lines EDBL[0:7] and EDBR[0:7] during a write operation. The I/O circuit 260 outputs read data Data[0:63] corrected by the ECC circuit 250 to the outside during a read operation. Alternatively, the I/O circuit 260 outputs data delivered through the first to eighth data lines GIO[0:63] or the ninth and tenth data line EDBL[0:7] and EDBR[0:7] to the outside as the read data Data[0:63], during the read operation.

Figure 12:
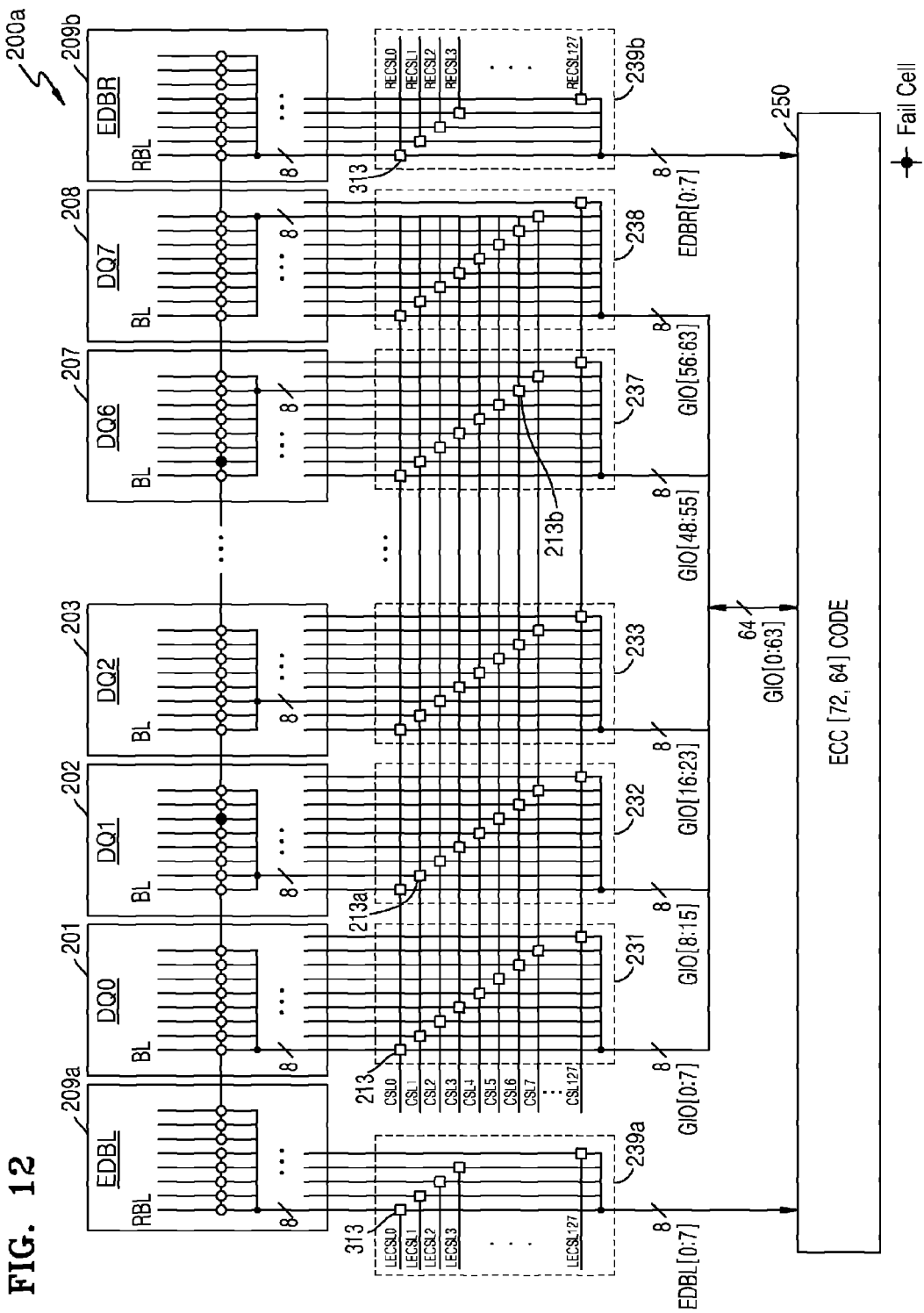
FIGS. 12 to 15 are diagrams for explaining exemplary methods of repairing 'fail' cells according to a codeword size of the memory device of FIG. 11, according to certain embodiments.
Figure 13:
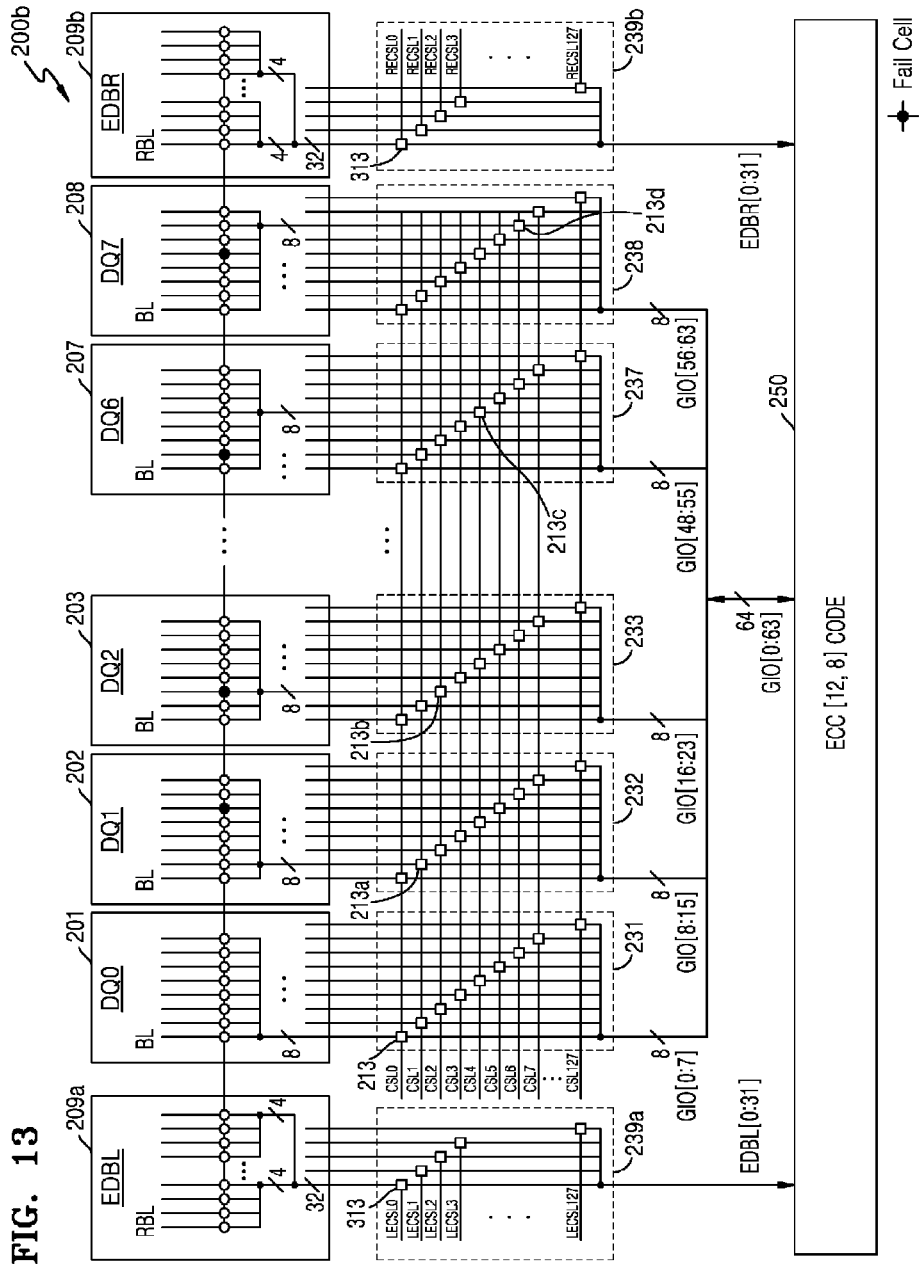
Figure 14:
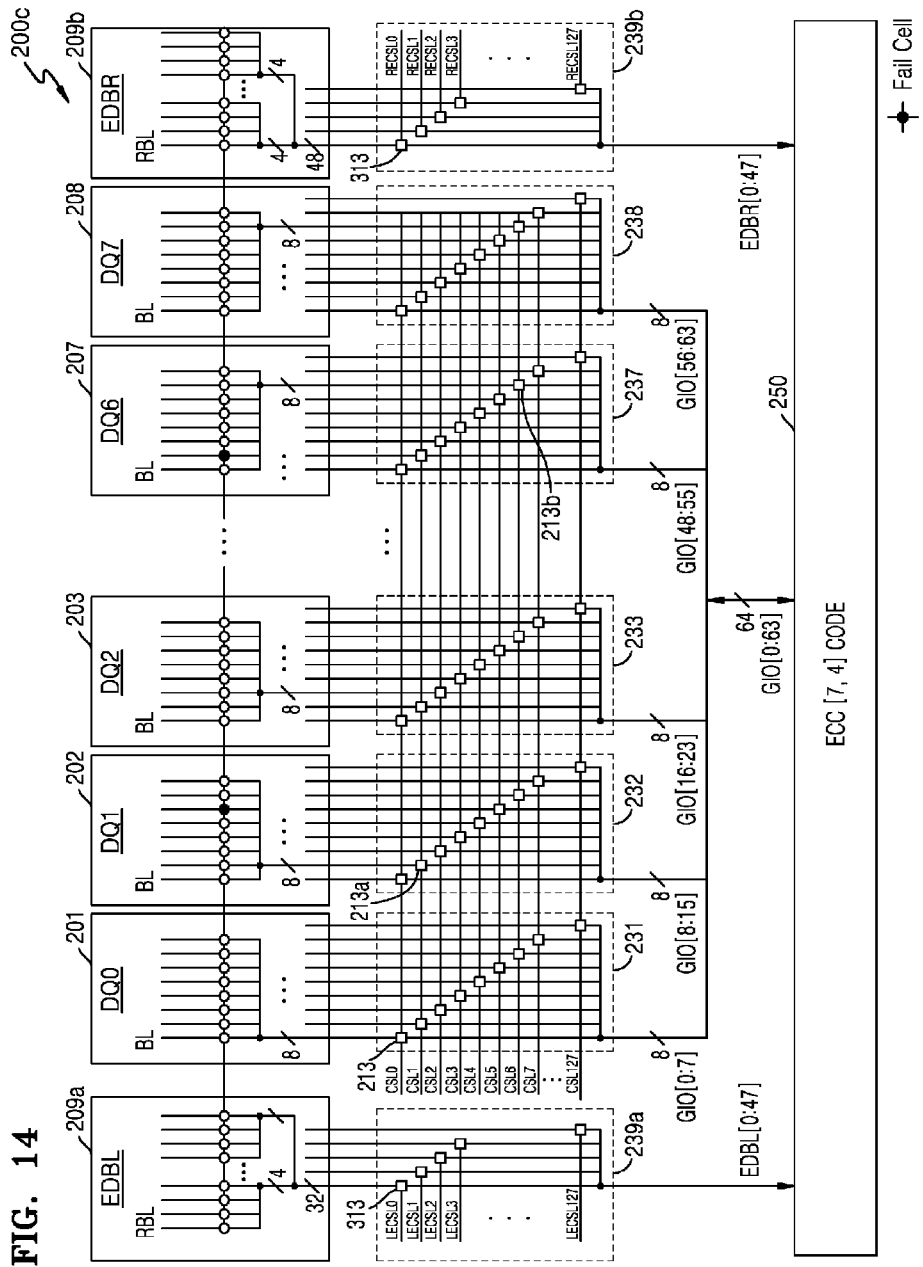
Figure 15:
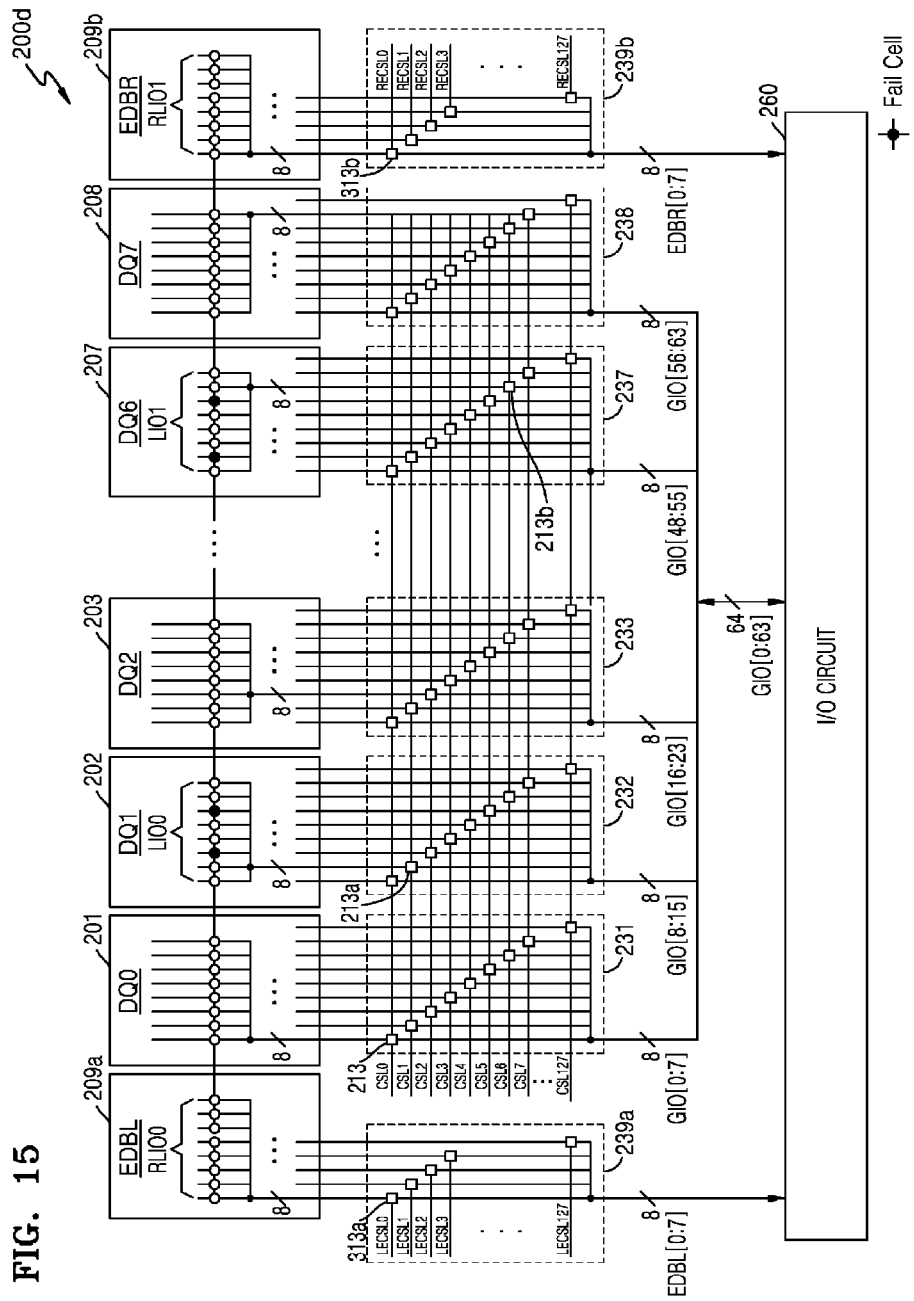

FIGS. 12 to 15 are diagrams for explaining exemplary methods of repairing 'fail' cells according to a codeword size of the memory device 200 of FIG. 11. FIG. 12 is a diagram for explaining an exemplary method of performing an ECC operation by using [72, 64] Hamming codes, FIG. 13 is a diagram for explaining an exemplary method of performing an ECC operation by using [12, 8] Hamming codes, FIG. 14 is a diagram for explaining an exemplary method of performing an ECC operation by using [7, 4] Hamming codes, and FIG. 15 is a diagram for explaining an exemplary method of repairing data lines.

Referring to FIG. 12, when a memory device 200a is set such that each of DQ0 to DQ7 cell blocks 201 to 208 includes 1 K bit lines and the burst length is equal to '8', bit lines BL of each of the DQ0 to DQ7 cell blocks 201 to 208 are connected to column selection units 213 to which 128 column selection signals CSL0 to CSL127 are supplied, respectively. The column selection units 213 that are connected to the DQ0 to DQ7 cell blocks 201 to 208 may be included in first switching units 231 to 238.

In one embodiment, eight bit lines BL may be simultaneously selected by one of the column selection units 213. Each of the column selection units 213 may include, for example, eight switches, and the column selection units 213 are turned on by the column selection signals CSL0 to CSL127. The column selection signals CSL0 to CSL127 are controlled by a first control signal CTRL1 of FIG. 11 that is output from the control logic unit 230 of FIG. 11.

In one embodiment, first and second EDB cell blocks 209a and 209b each may include 1 K bit lines, like the DQ0 to DQ7 cell blocks 201 to 208. Bit lines RBL of the first EDB cell block 209a are connected to column selection units 313 to which 128 column selection signals LECSL0 to LECSL127 are supplied, respectively. Bit lines RBL of the second EDB cell block 209b are connected to column selection units 313 to which 128 column selection signals RECSL0 to RECSL127 are supplied, respectively. The column selection units 313 that are connected to the first and second EDB cell blocks 209a and 209b may be included in second switching units 239a and 239b.

Eight bit lines RBL may be simultaneously selected by one of the column selection units 313. Each of the column selection units 313 may include eight switches, and the column selection units 313 are turned on by the column selection signals LECSL0 to LECSL127 and RECSL0 to RECSL127. The column selection signals LECSL0 to LECSL127 and RECSL0 to RECSL127 are controlled by the first control signal CTRL1 of FIG. 11 that is output from the control logic unit 230 of FIG. 11.

For example, in the memory device 200a, one 'fail' cell may be present among 64 memory cells that are selected by a word line WL and a column selection unit 213a connected to a column selection signal CSL1 of the DQ1 cell block 202, and one 'fail' cell may be present among 64 memory cells that are selected by a word line WL and a column selection unit 213b connected to a column selection signal CSL6 of the DQ6 cell block 207. An ECC circuit 250 may perform an ECC operation by using [72, 64] Hamming codes with respect to the two 'fail' cells.

The ECC circuit 250 may use the first EDB cell block 209a to detect and correct a 'fail' cell of the DQ1 cell block 202. The ECC circuit 250 generates parity bits regarding data Data[0:63] that are stored in memory cells of the DQ0 to DQ7 cell blocks 201 to 208, which are connected to the 'fail' cell of the DQ1 cell block 202. The parity bits are stored in or read from eight memory cells in the first EDB cell block 209a through ninth data lines EDBL[0:7]. In this case, the eight memory cells of the first EDB cell block 209a are connected to the same word line WL as the 'fail' cell of the DQ1 cell block 202.

The ECC circuit 250 may use the second EDB cell block 209b to detect and correct a 'fail' cell of the DQ6 cell block 207. The ECC circuit 250 generates parity bits regarding data Data[0:63] that are stored in memory cells of the DQ0 to DQ7 cell blocks 201 to 208, which are connected to the 'fail' cell of the DQ6 cell block 207. The parity bits are stored in or read from eight memory cells in the second EDB cell block 209b through tenth data lines EDBR[0:7]. In this case, the eight memory cells of the second EDB cell block 209b are connected to the same word line WL as the 'fail' cell of the DQ6 cell block 207.

When one 'fail' cell is present among memory cells that are selected by each of the two different column selection units 213a and 213b, the ECC circuit 250 may use [72, 64]

Hamming codes with respect to 64 data bits. The ECC circuit 250 generates 7 parity bits for detecting and correcting a 'fail' cell by using the [72, 64] Hamming codes, and stores the generated 7 parity bits in each of the first and second EDB cell blocks 209*a* and 209*b*.

Referring to FIG. 13, a memory device 200*b* is the same as the memory device 200*a* of FIG. 12, except that an ECC circuit 250 generates 4 parity bits by using [12, 8] Hamming codes with respect to 8 data bits.

In the memory device 200*b*, for example, one 'fail' cell may be present among 64 memory cells that are selected by a word line WL and a column selection unit 213*a* connected to a column selection signal CSL1 of a DQ1 cell block 202, and one 'fail' cell may be present among 64 memory cells that are selected by a word line WL and a column selection unit 213*b* connected to a column selection signal CSL2 of a DQ2 cell block 203. In addition, one 'fail' cell may be present among 64 memory cells that are selected by a word line WL and a column selection unit 213*c* connected to a column selection signal CSL4 of a DQ6 cell block 207, and one 'fail' cell may be present among 64 memory cells that are selected by a word line WL and a column selection unit 213*d* connected to a column selection signal CSL6 of a DQ7 cell block 208. The ECC circuit 250 may perform an ECC operation by using the [12, 8] Hamming codes with respect to the four 'fail' cells.

The ECC circuit 250 may use a first EDB cell block 209*a* to detect and correct a 'fail' cell of the DQ1 cell block 202. The ECC circuit 250 generates parity bits regarding data Data[8:15] that are stored in memory cells of the DQ1 cell block 202, which are connected to the 'fail' cell of the DQ1 cell block 202. Parity bits regarding data Data[0:63] that are stored in memory cells of DQ0 to DQ7 cell blocks 201 to 208, which are connected to the 'fail' cell of the DQ1 cell block 202, are stored in or read from memory cells in the first EDB cell block 209*a* through ninth data lines EDBL[0:31].

The ECC circuit 250 may use the first EDB cell block 209*a* to detect and correct a 'fail' cell of the DQ2 cell block 203. The ECC circuit 250 generates parity bits regarding data Data[16:23] that are stored in memory cells of the DQ2 cell block 203, which are connected to the 'fail' cell of the DQ2 cell block 203. Parity bits regarding data Data[0:63] that are stored in memory cells of the DQ0 to DQ7 cell blocks 201 to 208, which are connected to the 'fail' cell of the DQ2 cell block 203, are stored in or read from memory cells in the first EDB cell block 209*a* through the ninth data lines EDBL[0:31].

The ECC circuit 250 may use a second EDB cell block 209*b* to detect and correct a 'fail' cell of the DQ6 cell block 207. The ECC circuit 250 generates parity bits regarding data Data[48:55] that are stored in memory cells of the DQ6 cell block 207, which are connected to the 'fail' cell of the DQ6 cell block 207. Parity bits regarding data Data[0:63] that are stored in memory cells of the DQ0 to DQ7 cell blocks 201 to 208, which are connected to the 'fail' cell of the DQ6 cell block 207, are stored in or read from memory cells in the second EDB cell block 209*b* through tenth data lines EDBR[0:31].

The ECC circuit 250 may use the second EDB cell block 209*b* to detect and correct a 'fail' cell of the DQ7 cell block 208. The ECC circuit 250 generates parity bits regarding data Data[56:63] that are stored in memory cells of the DQ7 cell block 208, which are connected to the 'fail' cell of the DQ7 cell block 208. Parity bits regarding data Data[0:63] that are stored in memory cells of the DQ0 to DQ7 cell blocks 201 to 208, which are connected to the 'fail' cell of the DQ7 cell block 208, are stored in or read from memory cells in the second EDB cell block 209*b* through the tenth data lines EDBR[0:31].

When one 'fail' cell is present among memory cells that are selected by each of the four different column selection units 213*a* to 213*b*, the ECC circuit 250 may use [12, 8] Hamming codes with respect to 8 data bits. The ECC circuit 250 generates 4 parity bits for detecting and correcting a 'fail' cell by using the [12, 8] Hamming codes, and stores the generated 4 parity bits in each of the first and second EDB cell blocks 209*a* and 209*b*.

Referring to FIG. 14, a memory device 200*c* is the same as the memory device 200*b* of FIG. 13, except that an ECC circuit 250 uses [7, 4] Hamming codes with respect to 4 data bits.

In the memory device 200*c*, for example, one 'fail' cell may be present among 8 memory cells that are selected by a word line WL and a column selection unit 213*a* connected to a column selection signal CSL1 of a DQ1 cell block 202, and one 'fail' cell may be present among 8 memory cells that are selected by a word line WL and a column selection unit 213*b* connected to a column selection signal CSL6 of a DQ6 cell block 207. The ECC circuit 250 may perform an ECC operation by using the [7, 4] Hamming codes with respect to the two 'fail' cells.

The ECC circuit 250 may use a first EDB cell block 209*a* to detect and correct a 'fail' cell of the DQ1 cell block 202. The ECC circuit 250 may divide data Data[8:15], which are stored in memory cells of the DQ1 cell block 202 which are connected to the 'fail' cell of the DQ1 cell block 202, by 4 bits. The ECC circuit 250 generates 3 parity bits regarding each 4-bit data obtained by the division. Parity bits regarding data Data[0:63] that are stored in memory cells of DQ0 to DQ7 cell blocks 201 to 208, which are connected to the 'fail' cell of the DQ1 cell block 202, are stored in or read from memory cells in the first EDB cell block 209*a* through ninth data lines EDBL[0:47].

The ECC circuit 250 may use a second EDB cell block 209*a* to detect and correct a 'fail' cell of the DQ6 cell block 207. The ECC circuit 250 may divide data Data[48:55], which are stored in memory cells of the DQ6 cell block 207 which are connected to the 'fail' cell of the DQ6 cell block 207, by 4 bits. The ECC circuit 250 generates 3 parity bits regarding each 4-bit data obtained by the division. Parity bits regarding data Data[0:63] that are stored in memory cells of the DQ0 to DQ7 cell blocks 201 to 208, which are connected to the 'fail' cell of the DQ6 cell block 207, are stored in or read from memory cells in the second EDB cell block 209*b* through tenth data lines EDBR[:47].

The ECC circuit 250 may divide 8-bit data including an error bit due to a 'fail' cell by 4 bits to use [7, 4] Hamming codes. The ECC circuit 250 generates 3 parity bits for detecting and correcting an error bit by using the [7, 4] Hamming codes, and stores the generated 3 parity bits in each of the first and second EDB cell blocks 209*a* and 209*b*.

Referring to FIG. 15, a memory device 200*d* may use first and second EDB cell blocks 209*a* and 209*b* to repair codewords having a two-bit error. For example, two 'fail' cells may be present among 64 memory cells that are selected by a word line WL and a column selection unit 213*a* connected to a column selection signal CSL1 of a DQ1 cell block 202, and two 'fail' cells may be present among 64 memory cells that are selected by a word line WL and a column selection unit 213*b* connected to a column selection signal CSL6 of a DQ6 cell block 207. As such, a two-bit error is present in a codeword corresponding to the column selection signal CSL1 of the DQ1 cell block 202, and a two-bit error is present in a codeword corresponding to the column selection signal CSL6 of the DQ6 cell block 207.

The control logic unit 240 of FIG. 11 disconnects second data lines GIO[8:15] from local data lines LIO0 that are selected by a column selection unit 231a connected to the column selection signal CSL1 of the DQ1 cell block 202, and activates one of selection signals LECSL0 to LECSL127 of the first EDB cell block 209a, i.e., a selection signal LECSL1, instead of the column selection signal CSL1 of the DQ1 cell block 202. Local data lines RLIO0 of the first EDB cell block 209a, which are selected by a column selection unit 313a connected to the selection signal LECSL0, are selected instead of the local data lines LIO0 of the DQ1 cell block 202 and are connected to ninth data lines EDBL[0:7].

The control logic unit 240 of FIG. 11 disconnects second data lines GIO[48:55] from local data lines LIO1 that are selected by a column selection unit 231b connected to the column selection signal CSL6 of the DQ6 cell block 207, and activates one of selection signals RECSL0 to RECSL127 of the second EDB cell block 209b, i.e., a selection signal RECSL1, instead of the column selection signal CSL6 of the DQ6 cell block 207. Local data lines RLIO1 of the second EDB cell block 209b, which are selected by a column selection unit 313b connected to the selection signal RECSL0, are selected instead of the local data lines LIO1 of the DQ6 cell block 207 and are connected to tenth data lines EDBR[0:7]).

During a write operation, the memory device 200d delivers data Data[8:15] to be delivered to the DQ1 cell block 202 from among write data Data[0:63], which are received via an I/O circuit 260 from the outside, to the ninth data lines EDBL[0:7]. Data Data[0:7] and Data[16:63]) to be delivered to the DQ0 and DQ2 to DQ7 cell blocks 201 and 203 to 208 from among the write data Data[0:63] are stored in memory cells of the DQ0 and DQ2 to DQ7 cell blocks 201 and 203 to 208, which are connected to a word line WL, via first and third to eighth data lines GIO[0:7] and GIO[16:63] and first switching units 231 and 233 to 238. Data Data[8:15] on the ninth data line EDBL[0:7] are stored in memory cells of the first EDB cell block 209a, which are connected to the word line WL.

During a read operation, the memory device 200d delivers data read from the DQ0 and DQ2 to DQ7 cell blocks 201 and 203 to 208 to the first and third to eighth data lines GIO[0:7] and GIO[16:63] via the first switching units 231 and 233 to 238, and delivers data read from the first EDB cell block 209a to the ninth data line EDBL[0:7] via the second switching unit 239a. The read data delivered to the first and third to eighth data lines GIO[0:7] and GIO[16:63] and the ninth data line EDBL[0:7] is output through the I/O circuit 260.

In addition, during the write operation, the memory device 200d delivers data Data[48:55] to be delivered to the DQ6 cell block 207 from among the write data Data[0:63], which are received via the I/O circuit 260 from the outside, to the tenth data lines EDBR[0:7]. Data Data[0:47] and Data[56:63] to be delivered to the DQ0 to DQ5 and DQ7 cell blocks 201 to 206 and 208 from among the write data Data[0:63] are stored in memory cells of the DQ0 to DQ5 and DQ7 cell blocks 201 to 206 and 208, which are connected to a word line WL, via first to sixth and eighth lines GIO[0:47] and GIO[56:63] and the first switching units 231 to 236 and 238. Data Data[48:55] on the tenth data line EDBR[0:7] are stored in memory cells of the second EDB cell block 209b, which are connected to the word line WL.

During the read operation, the memory device 200d delivers data read from the DQ0 to DQ5 and DQ7 cell blocks 201 to 206 and 208 to the first to sixth and eighth lines GIO[0:47] and GIO[56:63] via the first switching units 231 to 236 and 238, and delivers data read from the second EDB cell block 209b to the tenth data line EDBR[0:7] via the second switching unit 239b. The read data delivered to the first to sixth and eighth lines GIO[0:47] and GIO[56:63] and the tenth data line EDBR[0:7] is output through the I/O circuit 260.

FIGS. 16 to 20 illustrate memory modules each including a DRAM for performing both an ECC operation and a redundancy repair operation, according to various embodiments of the inventive concept.

Figure 16:
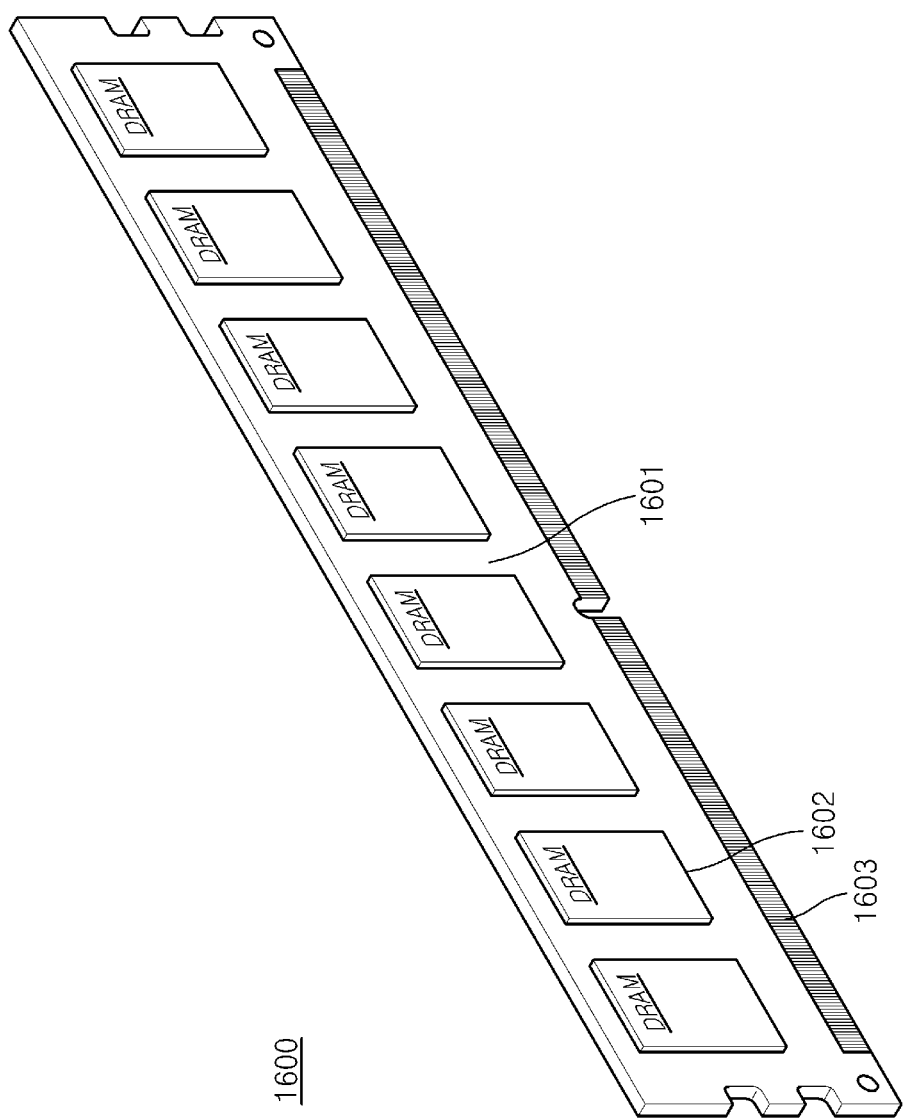
FIGS. 16 to 20 are diagrams illustrating memory modules each including a DRAM for performing both an ECC operation and a redundancy repair operation, according to various exemplary embodiments.

Referring to FIG. 16, a memory module 1600 includes a printed circuit board 1601, a plurality of DRAM chips 1602, and a connector 1603. The plurality of DRAM chips 1602 may be combined with an upper surface and a lower surface of the printed circuit board 1601. The connector 1603 is electrically connected to the plurality of DRAM chips 1602 via conductive lines. Also, the connector 1603 may be connected to a slot of an external host.

Although not shown, each of the plurality of DRAM chips 1602 may include a first memory cell array (e.g., DQ0 to DQ7 cell blocks), a second memory cell array (e.g., an EDB cell block), a control logic unit, and an ECC circuit. A second memory cell block may store parity bits of an ECC operation of repairing a 'fail' cell in a first memory cell block. If the 'fail' cell is not repairable by the ECC operation, the 'fail' cell may be repaired by a redundancy repair operation.

The control logic unit may store an address of a 'fail' cell of the first memory cell block, and may compare an address applied from the outside and the address of the 'fail' cell and may control an ECC operation or redundancy repair operation of the second memory cell block. During the redundancy repair operation, the control logic unit may make a data line connected to the 'fail' cell in the first memory cell block not selectable, and may make a data line of the second memory cell block selectable instead of the data line of the first memory cell block. In addition, during the redundancy repair operation, the control logic unit may make a first block including the 'fail' cell of the first memory cell block not selectable, and may make a second block of the second memory cell block selectable instead of the first block of the first memory cell block.

The ECC circuit may generate first parity bits regarding a first codeword corresponding to data per one unit of the first memory cell block including the 'fail' cell. The ECC circuit may detect the location of an error bit of the first codeword by using the first codeword and the first parity bits, and then may correct error bit data and output error-corrected data. Also, the ECC circuit may generate second parity bits regarding a second codeword obtained by changing the size of the first codeword. The ECC circuit may detect the location of an error bit of the second codeword by using the second codeword and the second parity bits, and then may correct error bit data and output error-corrected data.

Figure 17:
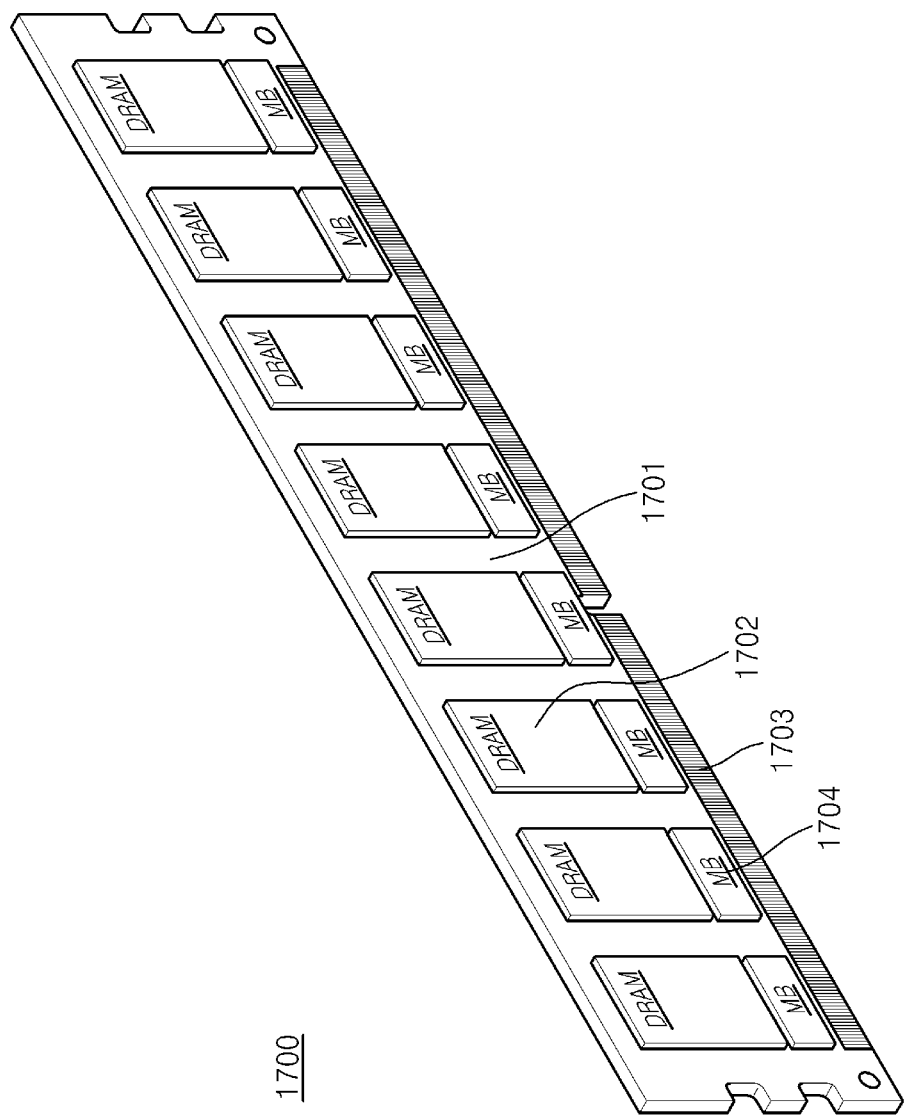

Referring to FIG. 17, a memory module 1700 includes a printed circuit board 1701, a plurality of DRAM chips 1702, a connector 1703, and a plurality of buffer chips 1704. Each of the plurality of buffer chips 1704 may be disposed between one of the plurality of DRAM chips 1702 and the connector 1703. The plurality of DRAM chips 1702 and the plurality of buffer chips 1704 may be mounted on an upper surface and a lower surface of the printed circuit board 1701. The plurality of DRAM chips 1702 and the plurality of buffer chips 1704 mounted on the upper surface and the lower surface of the printed circuit board 1701 may be connected, for example, via a plurality of via holes.

Although not shown, each of the plurality of DRAM chips 1702 may include a first memory cell array (DQ0 to DQ7 cell blocks), a second memory cell array (an EDB cell block), a control logic unit, and an ECC circuit. A second memory cell block may store parity bits of an ECC operation of repairing a 'fail' cell in a first memory cell block. If the 'fail' cell is not repairable by the ECC operation, the 'fail' cell may be repaired by a redundancy repair operation.

The control logic unit may store an address of a 'fail' cell of the first memory cell block, and may compare an address applied from the outside and the address of the 'fail' cell and may control an ECC operation or redundancy repair operation of the second memory cell block. During the redundancy repair operation, the control logic unit may make a data line connected to the 'fail' cell of the first memory cell block not selectable, and may make a data line of the second memory cell block selectable instead of the data line of the first memory cell block. In addition, during the redundancy repair operation, the control logic unit may make a first block including the 'fail' cell of the first memory cell block not selectable, and may make a second block of the second memory cell block selectable instead of the first block of the first memory cell block.

The ECC circuit may generate first parity bits regarding a first codeword corresponding to data per one unit of the first memory cell block including the 'fail' cell. The ECC circuit may detect the location of an error bit of the first codeword by using the first codeword and the first parity bits, and then may correct error bit data and output error-corrected data. Also, the ECC circuit may generate second parity bits regarding a second codeword obtained by changing the size of the first codeword. The ECC circuit may detect the location of an error bit of the second codeword by using the second codeword and the second parity bits, and then may correct error bit data and output error-corrected data.

The buffer chips 1704 may store a result of testing the characteristics of the plurality of DRAM chips 1702 connected to the plurality of buffer chips 1704. The buffer chips 1704 may manage the operations of the DRAM chips 1702 based on the stored result, thereby reducing influences on the DRAM chips 1702 due to a weak cell or a weak page. For example, the buffer chips 1704 may each include a storage space therein to repair a weak cell or a weak page in the DRAM chips 1702.

Figure 18:
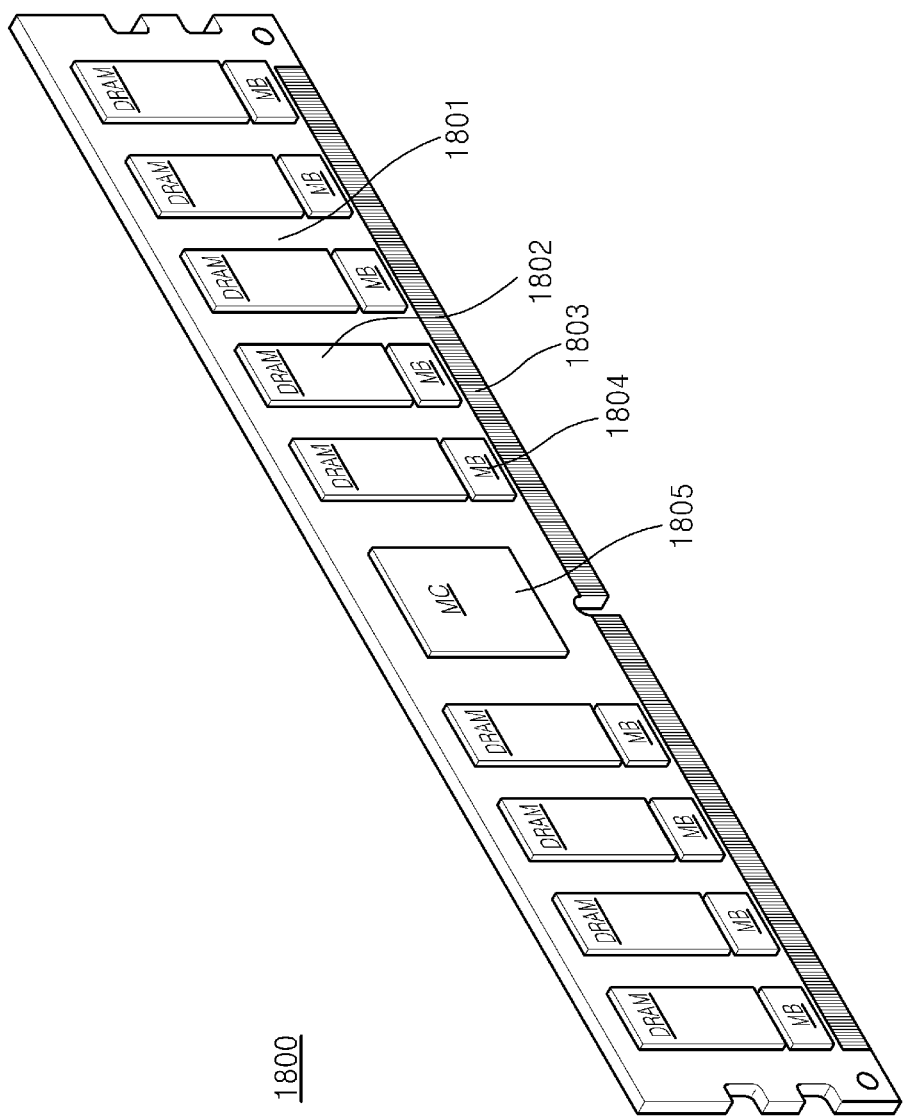

Referring to FIG. 18, a memory module 1800 includes a printed circuit board 1801, a plurality of DRAM chips 1802, a connector 1803, a plurality of buffer chips 1804, and a controller 1805. The controller 1805 communicates with the plurality of DRAM chips 1802 and the plurality of buffer chips 1804, and controls operating modes of the DRAM chips 1802. The controller 1805 may control various functions, characteristics, and modes by using mode registers (not shown) of the DRAM chip 1802.

Although not shown, each of the plurality of DRAM chips 1802 may include a first memory cell array (DQ0 to DQ7 cell blocks), a second memory cell array (an EDB cell block), a control logic unit, and an ECC circuit. A second memory cell block may store parity bits of an ECC operation of repairing a 'fail' cell in a first memory cell block. If the 'fail' cell is not repairable by the ECC operation, the 'fail' cell may be repaired by a redundancy repair operation.

The control logic unit may store an address of a 'fail' cell of the first memory cell block, and may compare an address applied from the outside and the address of the 'fail' cell and may control an ECC operation or redundancy repair operation of the second memory cell block. During the redundancy repair operation, the control logic unit may make a data line connected to the 'fail' cell of the first memory cell block not selectable, and may make a data line of the second memory cell block selectable instead of the data line of the first memory cell block. In addition, during the redundancy repair operation, the control logic unit may make a first block including the 'fail' cell of the first memory cell block not selectable, and may make a second block of the second memory cell block selectable instead of the first block of the first memory cell block.

The ECC circuit may generate first parity bits regarding a first codeword corresponding to data per one unit of the first memory cell block including the 'fail' cell. The ECC circuit may detect the location of an error bit of the first codeword by using the first codeword and the first parity bits, and then may correct error bit data and output error-corrected data. Also, the ECC circuit may generate second parity bits regarding a second codeword obtained by changing the size of the first codeword. The ECC circuit may detect the location of an error bit of the second codeword by using the second codeword and the second parity bits, and then may correct error bit data and output error-corrected data.

The memory modules 1600, 1700, and 1800 may be embodied as any of various memory modules, e.g., a single in-line memory module (SIMM), a dual in-line memory module (DIMM), a small-outline DIMM (SO-DIMM), an unbuffered DIMM (UDIMM), a fully-buffered DIMM (FB-DIMM), a rank-buffered DIMM (RBDIMM), a load-reduced DIMM (LRDIMM), a mini-DIMM, and a micro-DIMM.

Figure 19:
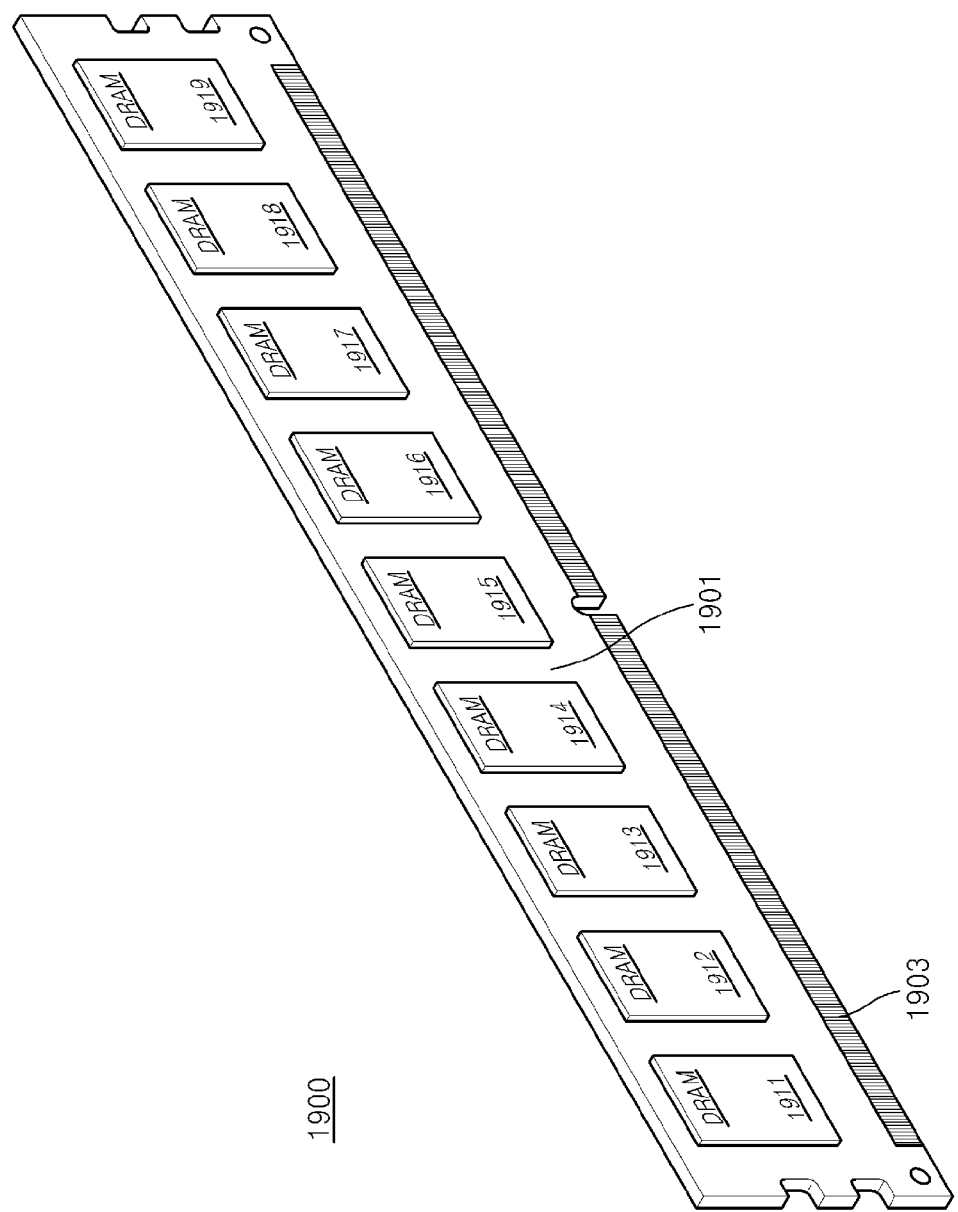

Referring to FIG. 19, a memory module 1900 includes a printed circuit board 1901, a plurality of DRAM chips 1911 to 1919, and a connector 1903. The plurality of DRAM chips 1911 to 1919 may be combined with an upper surface and a lower surface of the printed circuit board 1901. The connector 1903 is electrically connected to the plurality of DRAM chips 1911 to 1919 via conductive lines (not shown). Also, the connector 1903 may be connected to a slot of an external host (not shown).

First to eighth DRAM chips 1911 to 1918 of the plurality of DRAM chips 1911 to 1919 are memory chips determining a memory capacity of the memory module 1900 like the DQ0 to DQ7 cell blocks 101 to 108 illustrated in FIG. 1. Ninth DRAM chip 1919 is a memory chip for ECC and/or redundancy repair, which is used to repair 'fail' cells occurring in the first to eighth DRAM chips 1911 to 1918 like the EDB cell block 109 illustrated in FIG. 1. The ninth DRAM chip 1919 may store parity bits of an ECC operation of repairing a 'fail' cell in the first to eighth DRAM chips 1911 to 1918. If the 'fail' cell is not repairable by the ECC operation, the ninth DRAM chip 1919 may repair the 'fail' cell by using a redundancy repair operation.

The ninth DRAM chip 1919 may generate first parity bits regarding a first codeword corresponding to data per one unit of the first to eighth DRAM chips 1911 to 1918 including the 'fail' cell. The ninth DRAM chip 1919 may detect the location of an error bit of the first codeword by using the first codeword and the first parity bits, and then may correct error bit data and output error-corrected data. Also, the ninth DRAM chip 1919 may generate second parity bits regarding a second codeword obtained by changing the size of the first codeword. The ninth DRAM chip 1919 may detect the location of an error bit of the second codeword by using the second codeword and the second parity bits, and then may correct error bit data and output error-corrected data.

During the redundancy repair operation, the ninth DRAM chip 1919 may make a data line connected to the 'fail' cell of the first to eighth DRAM chips 1911 to 1918 not selectable, and may make a data line of the ninth DRAM chip 1919 selectable instead of the data line of the first to eighth DRAM chips 1911 to 1918. In addition, during the redundancy repair operation, the ninth DRAM chip 1919 may make a first block including the 'fail' cell of the first to eighth DRAM chips 1911 to 1918 not selectable, and may make a second block of the ninth DRAM chip 1919 selectable instead of a first block of the first to eighth DRAM chips 1911 to 1918.

Figure 20:
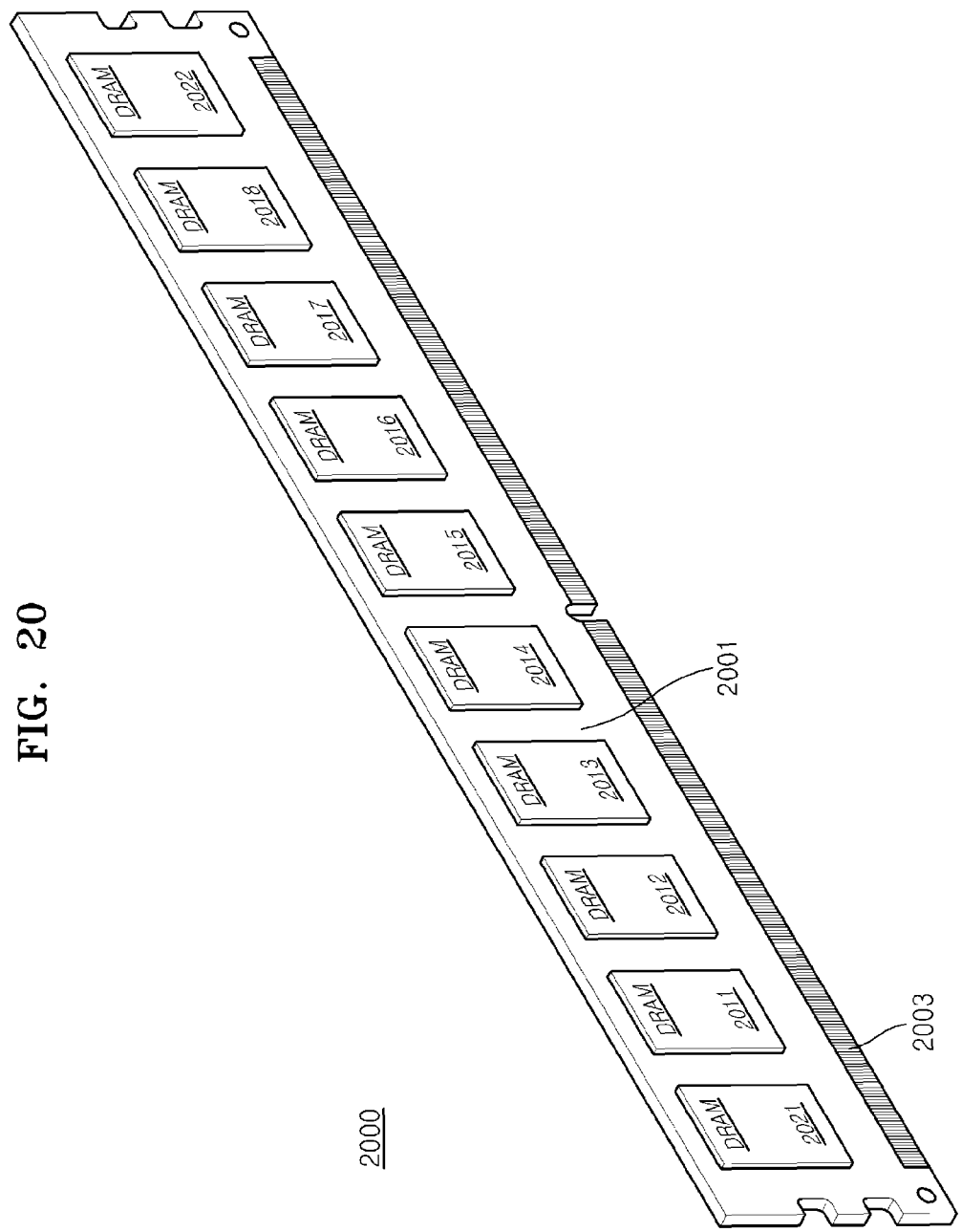

Referring to FIG. 20, a memory module 2000 includes a printed circuit board 2001, a plurality of DRAM chips 2011 to 2018, 2012, and 2022 and a connector 2003. The plurality of DRAM chips 2011 to 2018, 2012, and 2022 may be combined with an upper surface and a lower surface of the printed circuit board 2001. The connector 2003 is electrically connected to the plurality of DRAM chips 2011 to 2018, 2012, and 2022 via conductive lines (not shown). Also, the connector 2003 may be connected to a slot of an external host (not shown).

First to eighth DRAM chips 2011 to 2018 of the plurality of DRAM chips 2011 to 2018, 2012, and 2022 are memory chips determining a memory capacity of the memory module 2000 like the DQ0 to DQ7 cell blocks 201 to 208 illustrated in FIG. 11. Ninth and tenth DRAM chips 2021 and 2022 are memory chips for ECC and/or redundancy repair, which are used to repair 'fail' cells occurring in the first to eighth DRAM chips 2011 to 2018 like the first and second EDB cell blocks 209*a* and 209*b* illustrated in FIG. 11. The ninth and tenth DRAM chips 2021 and 2022 may store parity bits of an ECC operation of repairing a 'fail' cell in the first to eighth DRAM chips 2011 to 2018. If the 'fail' cell is not repairable by the ECC operation, the ninth and tenth DRAM chips 2021 and 2022 may repair the 'fail' cell by using a redundancy repair operation.

The ninth and tenth DRAM chips 2021 and 2022 may generate first parity bits regarding a first codeword corresponding to data per one unit of the first to eighth DRAM chips 2011 to 2018 including the 'fail' cell. The ninth and tenth DRAM chips 2021 and 2022 may detect the location of an error bit of the first codeword by using the first codeword and the first parity bits, and then may correct error bit data and output error-corrected data. Also, the ninth and tenth DRAM chips 2021 and 2022 may generate second parity bits regarding a second codeword obtained by changing the size of the first codeword. The ninth and tenth DRAM chips 2021 and 2022 may detect the location of an error bit of the second codeword by using the second codeword and the second parity bits, and then may correct error bit data and output error-corrected data.

During the redundancy repair operation, the ninth and tenth DRAM chips 2021 and 2022 may make a data line connected to the 'fail' cell of the first to eighth DRAM chips 2011 to 2018 not selectable, and may make a data line of the ninth and tenth DRAM chips 2021 and 2022 selectable instead of the data line of the first to eighth DRAM chips 2011 to 2018. In addition, during the redundancy repair operation, the ninth and tenth DRAM chips 2021 and 2022 may make a first block including the 'fail' cell of the first to eighth DRAM chips 2011 to 2018 not selectable, and may make a second block of the ninth and tenth DRAM chips 2021 and 2022 selectable instead of a first block of the first to eighth DRAM chips 2011 to 2018.

Figure 21:
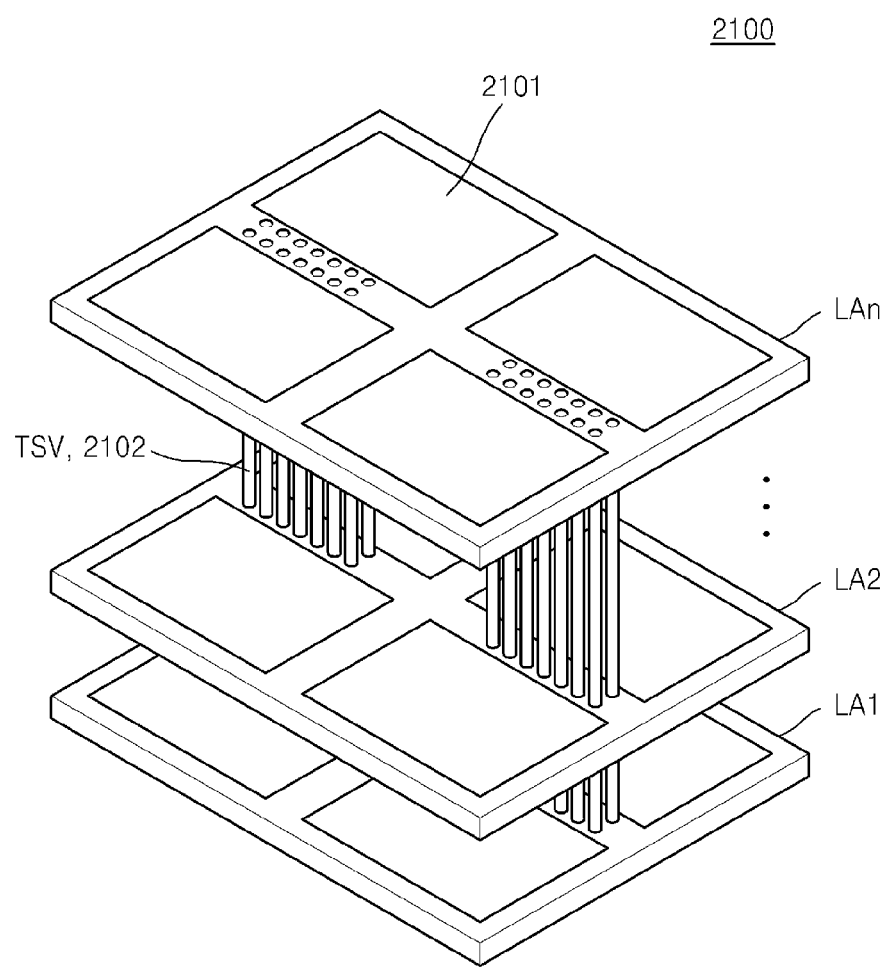
FIG. 21 is a diagram illustrating a semiconductor device having a stacked structure of DRAM semiconductor layers for performing both an ECC operation and a redundancy repair operation, according to one exemplary embodiment.

FIG. 21 is a diagram illustrating a semiconductor device 2100 having a stacked structure of DRAM semiconductor layers for performing both an ECC operation and a redundancy repair operation, according to exemplary embodiment.

Referring to FIG. 21, the semiconductor device 2100 may include a plurality of DRAM semiconductor layers LA1 to LAn. Each of the plurality of DRAM semiconductor layers LA1 to LAn may be a memory chip including memory cell arrays 2101 with DRAM cells. Some of the plurality of DRAM semiconductor layers LA1 to LAn may be master chips that interface with an external controller, and the other DRAM semiconductor layers may be slave chips that store data. In FIG. 21, for example, a lowermost semiconductor layer LA1 may be a master chip, and the other semiconductor layers LA2 to LAn may be slave chips.

The plurality of DRAM semiconductor layers LA1 to LAn may exchange signals with one another through conductive vias, such as through-substrate vias (e.g., through-silicon vias TSV 2102). The master chip LA1 may communicate with an external memory controller (not shown) via a conductive unit (not shown) formed on an external surface thereof.

In certain embodiments, signals may be exchanged among the plurality of DRAM semiconductor layers LA1 to LAn through an optical I/O connection, e.g., a radiation manner using radio frequency (RF) waves or ultrasound waves, an inductive coupling manner using magnetic induction, or a non-radiation manner using oscillation of a magnetic field.

In the radiation manner, signals are wirelessly transmitted using an antenna, such as a monopole antenna or a planar inverted-F antenna (PIFA). Radiation occurs as electric fields or magnetic fields that change according to time are influenced by each other. When antennas using the same frequency are used, a signal may be received according to the polarization characteristics of an incident wave. In the inductive coupling manner, a strong magnetic field is generated in one direction by winding a coil several times, and coupling is caused by disposing a coil that oscillates at a frequency similar to that of the wound coil to be adjacent to the wound coil. The non-radiation manner employs evanescent wave coupling to move electromagnetic waves between two media oscillating at the same frequency through a near-field electric field.

Although not shown, each of the plurality of DRAM semiconductor layers LA1 to LAn may include a first memory cell array (DQ0 to DQ7 cell blocks), a second memory cell array (an EDB cell block), a control logic unit, and an ECC circuit. A second memory cell block may store parity bits of an ECC operation of repairing a 'fail' cell in a first memory cell block. If the 'fail' cell is not repairable by the ECC operation, the 'fail' cell may be repaired by a redundancy repair operation.

The control logic unit may store an address of a 'fail' cell of the first memory cell block, and may compare an address applied from the outside and the address of the 'fail' cell and may control an ECC operation or redundancy repair operation of the second memory cell block. During the redundancy repair operation, the control logic unit may make a data line connected to the 'fail' cell of the first memory cell block not selectable, and may make a data line of the second memory cell block selectable instead of the data line of the first memory cell block. In addition, during the redundancy repair operation, the control logic unit may make a first block including the 'fail' cell of the first memory cell block not selectable, and may make a second block of the second memory cell block selectable instead of the first block of the first memory cell block.

The ECC circuit may generate first parity bits regarding a first codeword corresponding to data per one unit of the first memory cell block including the 'fail' cell. The ECC circuit may detect the location of an error bit of the first codeword by using the first codeword and the first parity bits, and then may correct error bit data and output error-corrected data. Also, the ECC circuit may generate second parity bits regarding a second codeword obtained by changing the size of the first codeword. The ECC circuit may detect the location of an error bit of the second codeword by using the second codeword and the second parity bits, and then may correct error bit data and output error-corrected data.

In the memory modules 1600 to 2000 of FIGS. 16 to 20, each of the DRAM chips may include the plurality of DRAM semiconductor layers LA1 to LAn.

Figure 22:
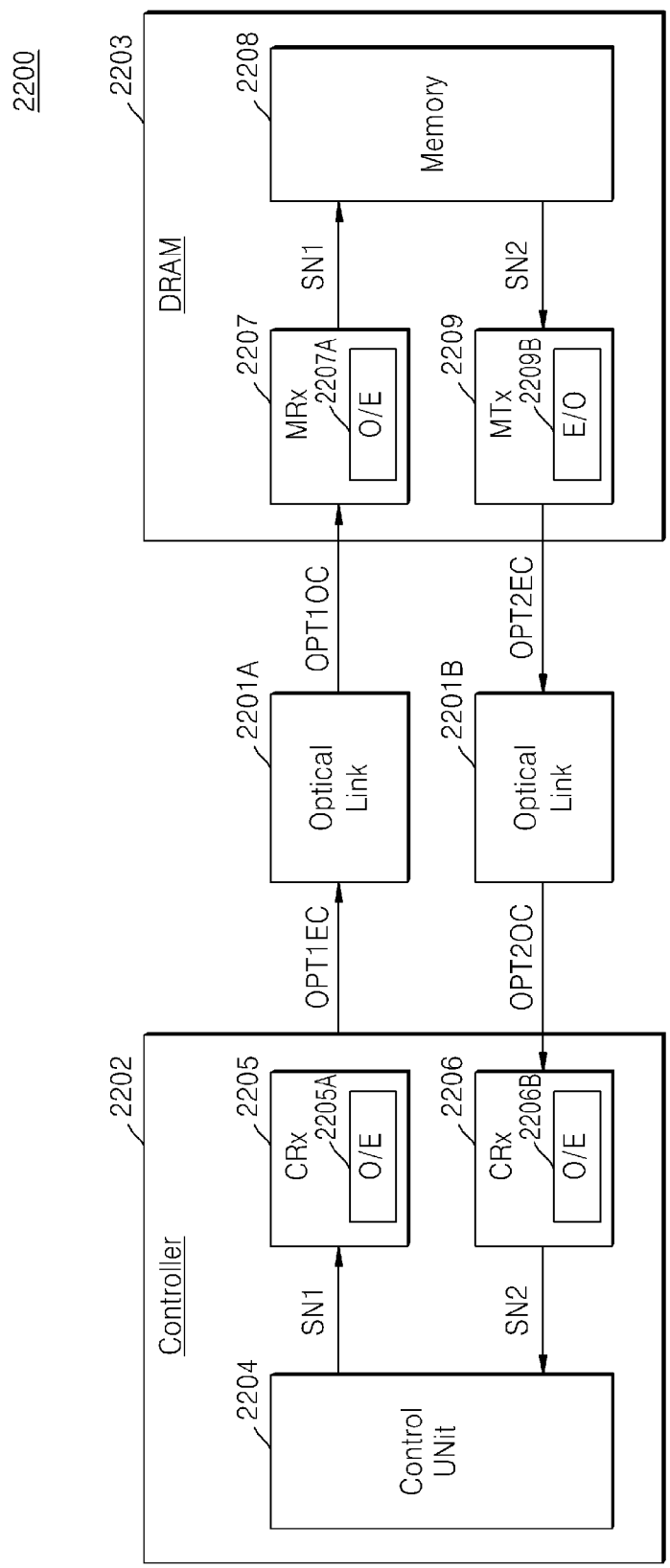
FIG. 22 is a block diagram of a memory system including a DRAM for performing both an ECC operation and a redundancy repair operation, according to one exemplary embodiment.

FIG. 22 is a block diagram of a memory system 2200 including a DRAM for performing both an ECC operation and a redundancy repair operation, according to an exemplary embodiment.

Referring to FIG. 22, the memory system 2200 includes optical link devices 2201A and 2201B, a controller 2202, and a DRAM 2203. The optical link devices 2201A and 2201B interconnect the controller 2202 and the DRAM 2203. The controller 2202 includes a control unit 2204, a first transmission unit 2205, and a first receiving unit 2206. The control unit 2204 transmits a first electrical signal SN1 to the first transmission unit 2205. The first electrical signal SN1 may include, for example, command signals, clock signals, address signals, or write data to be transmitted to the DRAM 2203.

The first transmission unit 2205 includes a first optical modulator 2205A. The first optical modulator 2205A converts the first electrical signal SN1 into a first optical transmission signal OTP1EC, and transmits the first optical transmission signal OTP1EC to the optical link device 2201A. The first optical transmission signal OTP1EC is transmitted through serial communication via the optical link device 2201A. The first receiving unit 2206 includes a first optical demodulator 2206B. The first optical demodulator 2206B converts a second optical receiving signal OPT2OC received from the optical link device 2201B into a second electrical signal SN2, and transmits the second electrical signal SN2 to the control unit 2204.

The DRAM 2203 includes a second receiving unit 2207, a memory region 2208 including a memory cell array, and a second transmission unit 2209. Although not shown, the memory region 2208 may include a first memory cell array (DQ0 to DQ7 cell blocks), a second memory cell array (an EDB cell block), a control logic unit, and an ECC circuit. A second memory cell block may store parity bits of an ECC operation of repairing a 'fail' cell in a first memory cell block. If the 'fail' cell is not repairable by the ECC operation, the 'fail' cell may be repaired by a redundancy repair operation.

The control logic unit may store an address of a 'fail' cell of the first memory cell block, and may compare an address applied from the outside and the address of the 'fail' cell and may control an ECC operation or redundancy repair operation of the second memory cell block. During the redundancy repair operation, the control logic unit may make a data line connected to the 'fail' cell of the first memory cell block not selectable, and may make a data line of the second memory cell block selectable instead of the data line of the first memory cell block. In addition, during the redundancy repair operation, the control logic unit may make a first block including the 'fail' cell of the first memory cell block not selectable, and may make a second block of the second memory cell block selectable instead of the first block of the first memory cell block.

The ECC circuit may generate first parity bits regarding a first codeword corresponding to data per one unit of the first memory cell block including the 'fail' cell. The ECC circuit may detect the location of an error bit of the first codeword by using the first codeword and the first parity bits, and then may correct error bit data and output error-corrected data. Also, the ECC circuit may generate second parity bits regarding a second codeword obtained by changing the size of the first codeword. The ECC circuit may detect the location of an error bit of the second codeword by using the second codeword and the second parity bits, and then may correct error bit data and output error-corrected data.

The second receiving unit 2207 includes a second optical demodulator 2207A. The second optical demodulator 2207A converts a first optical receiving signal OPT1OC received from the optical link device 2201A into the first electrical signal SN1, and transmits the first electrical signal SN1 to the memory region 2208.

In the memory region 2208, write data is written to a memory cell according to the first electrical signal SN1, or data read from the memory region 2208 is transmitted as the second electrical signal SN2 to the second transmission unit 2209. The second electrical signal SN2 may include, for example, a clock signal and read data to be transmitted to the memory controller 2202. The second transmission unit 2209 includes a second optical modulator 2209B. The second optical modulator 2209B converts the second electrical signal SN2 into a second optical data signal OPT2EC, and transmits the second optical data signal OPT2EC to the optical link device 2201B. The second optical transmission signal OTP2EC is transmitted according to serial communication via the optical link device 2201B.

Figure 23:
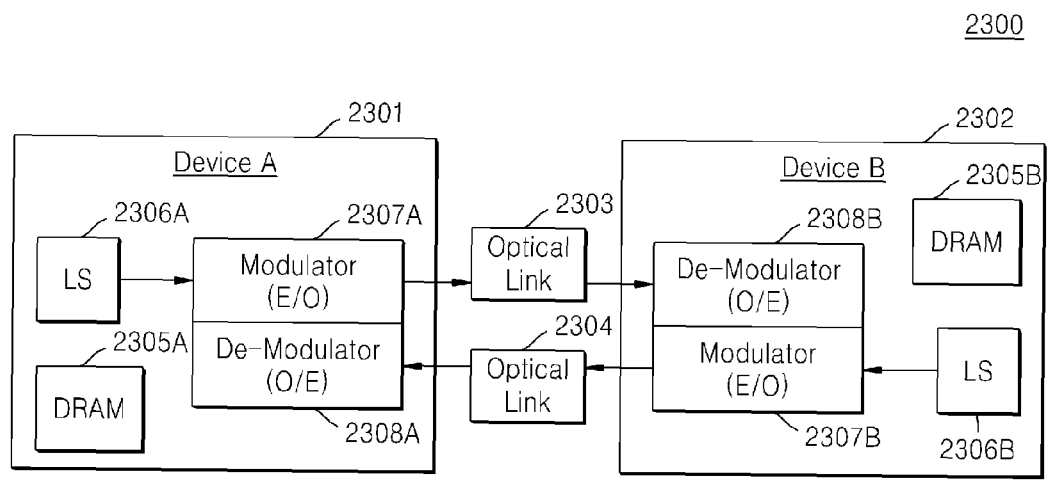
FIG. 23 is a block diagram of a data processing system including a DRAM for performing both an ECC operation and a redundancy repair operation, according to one exemplary embodiment.

FIG. 23 is a block diagram of a data processing system 2300 including a DRAM for performing both an ECC operation and a redundancy repair operation, according to one exemplary embodiment.

Referring to FIG. 23, the data processing system 2300 includes a first device 2301, a second device 2302, and a plurality of optical link devices 2303 and 2304. The first device 2301 and the second device 2302 may exchange optical signals with each other according to a serial communication protocol.

The first device 2301 may include, for example, a DRAM 2305A, a first light source 2306A, a first optical modulator 2307A capable of performing an electric-to-optical (E/O) conversion operation, and a first optical demodulator 2308A capable of performing an optical-to-electric (O/E) conversion operation. The second device 2302 includes a DRAM 2305B, a second light source 2306B, a second optical modulator 2307B, and a first optical demodulator 2308B.

Although not shown, each of the DRAMs 2305A and 2305B may include a first memory cell array (DQ0 to DQ7 cell blocks), a second memory cell array (an EDB cell block), a control logic unit, and an ECC circuit. A second memory cell block may stores parity bits of an ECC operation of repairing a 'fail' cell in a first memory cell block. If the 'fail' cell is a 'fail' cell that is not repairable by the ECC operation, the 'fail' cell may be repaired by a redundancy repair operation.

The control logic unit may store an address of a 'fail' cell of the first memory cell block, and may compare an address applied from the outside and the address of the 'fail' cell and may control an ECC operation or redundancy repair operation of the second memory cell block. During the redundancy repair operation, the control logic unit may make a data line connected to the 'fail' cell of the first memory cell block not selectable, and may make a data line of the second memory cell block selectable instead of the data line of the first memory cell block. In addition, during the redundancy repair operation, the control logic unit may make a first block including the 'fail' cell of the first memory cell block not selectable, and may make a second block of the second memory cell block selectable instead of the first block of the first memory cell block.

The ECC circuit may generate first parity bits regarding a first codeword corresponding to data per one unit of the first memory cell block including the 'fail' cell. The ECC circuit may detect the location of an error bit of the first codeword by using the first codeword and the first parity bits, and then may correct error bit data and output error-corrected data. Also, the ECC circuit may generate second parity bits regarding a second codeword obtained by changing the size of the first codeword. The ECC circuit may detect the location of an error bit of the second codeword by using the second codeword and the second parity bits, and then may correct error bit data and output error-corrected data.

The first and second light sources 2306A and 2306B output optical signals having continuous waveforms. For example, the first and second light sources 2306A and 2306B may each be a distributed feed-back laser diode (DFB-LD) which is a multi-wavelength light source or a fabry perot laser diode (FP-LD).

The first optical modulator 2307A converts transmission data into an optical transmission signal, and transmits the optical transmission signal to the optical link device 2303. The first optical modulator 2307A may modulate a wavelength of an optical signal received from the first light source 2306A based on transmission data. The first optical demodulator 2308A receives an optical signal received from the second optical modulator 2307B of the second device 2302 via the optical link device 2304, demodulates the optical signal, and outputs a demodulated electrical signal.

The second optical modulator 2307B converts transmission data received from the second device 2302 into an optical transmission signal, and also transmits the optical transmission signal to the optical link device 2304. The second optical modulator 2307B may modulate a wavelength of an optical signal received from the second light source 2306B, based on transmission data. The second optical demodulator 2308B receives an optical signal received from the first optical modulator 2107A of the second device 2301 via the optical link device 2303, demodulates the optical signal, and outputs a demodulated electrical signal.

Figure 24:
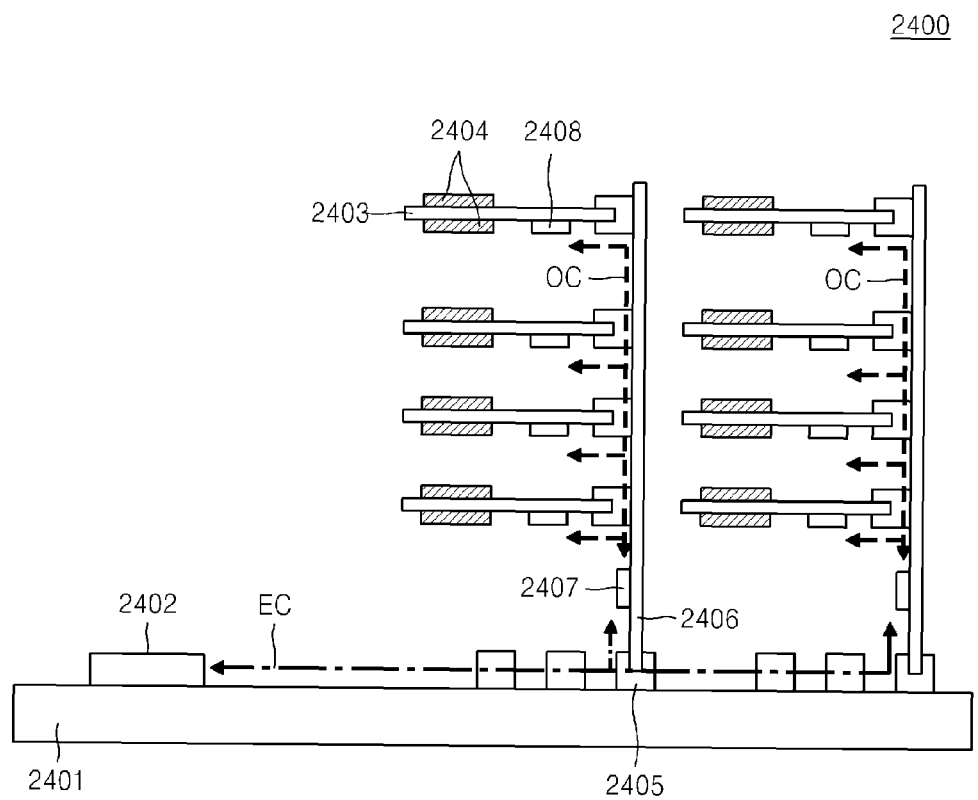
FIG. 24 is a diagram illustrating a server system including a DRAM for performing both an ECC operation and a redundancy repair operation, according to one exemplary embodiment.

FIG. 24 is a diagram illustrating a server system 2400 including a DRAM for performing both an ECC operation and a redundancy repair operation, according to another embodiment.

Referring to FIG. 24, the server system 2400 includes a memory controller 2402 and a plurality of memory modules 2403. Each of the plurality of memory modules 2403 may include a plurality of DRAM chips 2404.

Although not shown, each of the DRAMs 2404 may include a first memory cell array (DQ0 to DQ7 cell blocks), a second memory cell array (an EDB cell block), a control logic unit, and an ECC circuit. A second memory cell block may stores parity bits of an ECC operation of repairing a 'fail' cell in a first memory cell block. If the 'fail' cell is not repairable by the ECC operation, the 'fail' cell may be repaired by a redundancy repair operation.

The control logic unit may store an address of a 'fail' cell of the first memory cell block, and may compare an address applied from the outside and the address of the 'fail' cell and may control an ECC operation or redundancy repair operation of the second memory cell block. During the redundancy repair operation, the control logic unit may make a data line connected to the 'fail' cell of the first memory cell block not selectable, and may make a data line of the second memory cell block selectable instead of the data line of the first memory cell block. In addition, during the redundancy repair operation, the control logic unit may make a first block including the 'fail' cell of the first memory cell block not selectable, and may make a second block of the second memory cell block selectable instead of the first block of the first memory cell block.

The ECC circuit may generate first parity bits regarding a first codeword corresponding to data per one unit of the first memory cell block including the 'fail' cell. The ECC circuit may detect the location of an error bit of the first codeword by using the first codeword and the first parity bits, and then may correct error bit data and output error-corrected data. Also, the ECC circuit may generate second parity bits regarding a second codeword obtained by changing the size of the first codeword. The ECC circuit may detect the location of an error bit of the second codeword by using the second codeword and the second parity bits, and then may correct error bit data and output error-corrected data.

The server system 2400 may have a structure in which a second printed circuit board 2406 is combined with sockets 2405 on a first printed circuit board 2401. The server system 2400 may be designed to have a channel structure in which one second printed circuit board 2406 is connected to the first printed circuit board 2401 in units of signal channels. However, the inventive concept is not limited thereto, and the server system 2400 may have any of other various structures.

Signals may be exchanged among the memory modules 2403 through an optical I/O connection. For the optical I/O connection, the server system 2400 may further include an E/O conversion unit 2407, and each of the memory modules 2403 may further include an O/E conversion unit 2408.

The memory controller 2402 is connected to the E/O conversion unit 2407 via an electrical channel EC. The E/O conversion unit 2407 converts an electrical signal received from the memory controller 2402 via the electrical channel EC into an optical signal, and transmits the optical signal to an optical channel OC. Also, the E/O conversion unit 2407 converts an optical signal received via the optical channel OC into an electrical signal and transmits the electrical signal to the electrical channel EC.

The memory module 2403 is connected to the E/O conversion unit 2407 via the optical channel OC. An optical signal supplied to the memory module 2403 may be converted into an electrical signal through the O/E conversion unit 2408 and the electrical signal may then be transmitted to the DRAM chips 2404. The server system 2400 including the optical link memory modules as described above has a high storage capacity and a high-speed processing characteristic.

Figure 25:
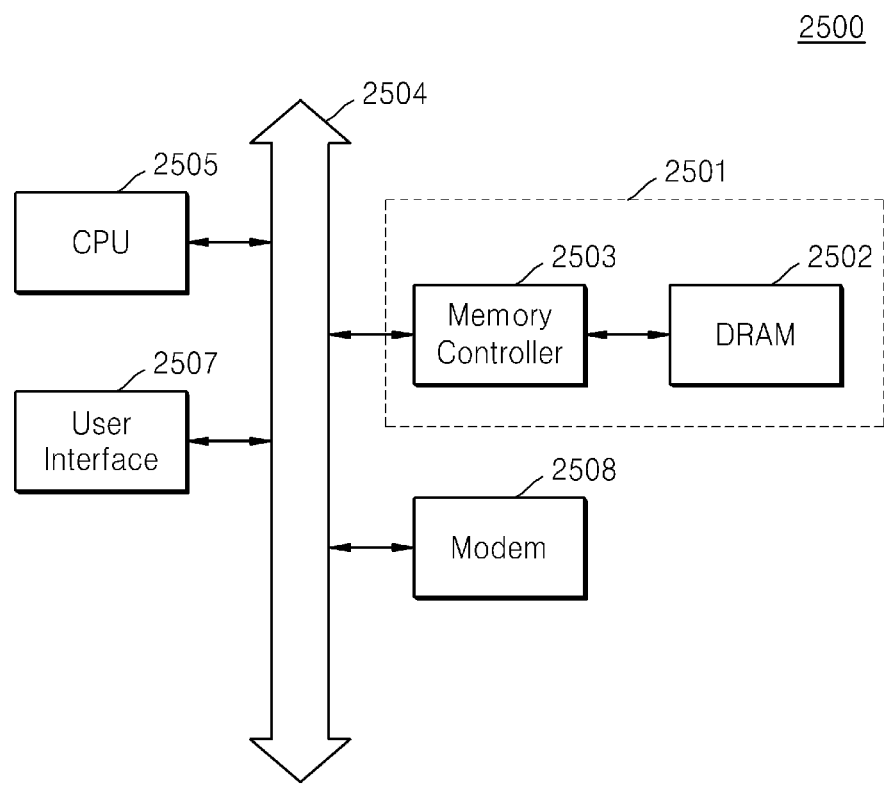
FIG. 25 is a block diagram of a computer system including a DRAM for performing both an ECC operation and a redundancy repair operation, according to one exemplary embodiment.

FIG. 25 is a block diagram of a computer system 2500 including a DRAM 2502 for performing both an ECC operation and a redundancy repair operation, according to one exemplary embodiment.

Referring to FIG. 25, the computer system 2500 may be mounted into a mobile device, a desktop computer, etc. The computer system 2500 may include a DRAM memory system 2501, a central processing unit (CPU) 2505, a user interface 2507, and a modem 2508, such as a baseband chipset, that are electrically connected via a system bus 2504. The computer system 2500 may further include an application chipset, a camera image processor (CIS), an I/O device, etc.

The user interface 2507 may be an interface via which data is transmitted to or received from a communication network. The user interface 2507 may be a wired/wireless interface or may include an antenna or a wired/wireless transceiver. Data that is provided via the user interface 2507 or the modem 2508 or that is processed by the CPU 2505 may be stored in the DRAM memory system 2501.

The DRAM memory system 2501 may include the DRAM 2502 and a memory controller 2503. The DRAM 2502 stores data that is processed by the CPU 2505 or that is input from the outside. Although not shown, the DRAM 2502 may include a first memory cell array (DQ0 to DQ7 cell blocks), a second memory cell array (an EDB cell block), a control logic unit, and an ECC circuit. A second memory cell block may stores parity bits of an ECC operation of repairing a 'fail' cell in a first memory cell block. If the 'fail' cell is a 'fail' cell that is not repairable by the ECC operation, the 'fail' cell may be repaired by a redundancy repair operation.

The control logic unit may store an address of a 'fail' cell of the first memory cell block, and may compare an address applied from the outside and the address of the 'fail' cell and may control an ECC operation or redundancy repair operation of the second memory cell block. During the redundancy repair operation, the control logic unit may make a data line connected to the 'fail' cell of the first memory cell block not selectable, and may make a data line of the second memory cell block selectable instead of the data line of the first memory cell block. In addition, during the redundancy repair operation, the control logic unit may make a first block including the 'fail' cell of the first memory cell block not selectable, and may make a second block of the second memory cell block selectable instead of the first block of the first memory cell block.

The ECC circuit may generate first parity bits regarding a first codeword corresponding to data per one unit of the first memory cell block including the 'fail' cell. The ECC circuit may detect the location of an error bit of the first codeword by using the first codeword and the first parity bits, and then may correct error bit data and output error-corrected data. Also, the ECC circuit may generate second parity bits regarding a second codeword obtained by changing the size of the first codeword. The ECC circuit may detect the location of an error bit of the second codeword by using the second codeword and the second parity bits, and then may correct error bit data and output error-corrected data.

If the computer system 2500 is used for wireless communication, the computer system 2500 may be used in a communication system such as code division multiple access (CDMA), global system for mobile communication (GSM), north american digital cellular (NADC), and CDMA2000. The computer system 2300 may be mounted into an information processing apparatus, such as a personal digital assistant (PDA), a portable computer, a web tablet, a digital camera, a portable media player (PMP), a mobile phone, a wireless phone, a laptop computer, etc.

In general, a system separately includes a cache memory having a high operating speed and a storage unit, such as RAM, which is used to store a large amount of data. In contrast, one DRAM system according to embodiments described herein may be replaced with all of the memories as described above. As such, a memory device including a DRAM according to the embodiments described herein is capable of rapidly storing a large amount of data, thereby simplifying a computer system structure.

The term "memory apparatus" is used herein as a general term describing one or more of a memory device, a memory module, etc. For example, a memory apparatus could be simply a memory device, such as a memory chip. Or, a memory apparatus could refer to a plurality of memory chips that together include normal memory cells and failure recovery cells. In another example, a memory apparatus could refer to a memory module, for example, that includes a plurality of memory devices (e.g., chips). Further, a memory device, as described herein may refer in some cases to a chip, and in other cases to a plurality of chips, for example, formed in a package.

While this disclosure has been particularly shown and described with reference to exemplary embodiments thereof, it will be understood that various changes in form and details may be made therein without departing from the spirit and scope of the following claims.

What is claimed is:

1. A memory device, comprising:
   a first memory cell block including a plurality of sub-blocks, each including a plurality of normal memory cells;
   a second memory cell block separate from the first memory cell block and including a plurality of failure recovery memory cells;
   a fail address storing unit configured to store fail addresses, the fail addresses including a first fail address and a second fail address, the first fail address and the second fail address indicating a first type of fail cells and a second type of fail cells respectively;
   a control circuit; and
   an error correction circuit,
   wherein the control circuit is configured to:
      receive addresses received from outside the memory device;
      compare the received addresses to the fail addresses;
      perform error correction using the second memory cell block by storing parity bits for error correction in the second memory cell block if the received address matches with a first fail address; and
      perform redundancy operation using the second memory cell block by accessing redundancy cells of the second memory block corresponding to fail cells of the first memory cell block if the received address matches with a second fail address.

2. The memory device of claim 1, further comprising:
   a plurality of switching circuits,
   wherein the control circuit is configured to switch on or off each switching circuit to control whether error correction is performed or whether redundancy operations are performed.

3. The memory device of claim 1, further comprising:
   performing the error correction by storing a parity bit in the second memory cell block; and
   using the second memory cell block for redundancy operations by storing data intended for the received address in a redundancy row of the second memory cell block.

4. The memory device of claim 1, wherein the first memory cell block shares word lines with the second memory cell block.

5. The memory device of claim 4, wherein performing error correction using the second memory cell block uses a first row of memory cells of the second memory cell block; and using the second memory cell block for redundancy operations uses a second row of memory cells of the second memory cell block.

6. A memory device, comprising:
a first memory cell block including a plurality of sub-blocks, each including a plurality of normal memory cells;
a second memory cell block including one or more sub-blocks, each including a plurality of failure recovery memory cells; and
an error correction circuit,
wherein the memory device is configured to:
use a first set of memory cells of the second memory cell block for error correction by storing parity bits for error correction in the first set of memory cells of the second memory cell block when a one-bit error occurs in a first row of normal memory cells of the first memory cell block, and
use a second set of memory cells of the second memory cell block for redundancy operations by accessing redundancy cells in the second set of memory cell of the second memory cell block corresponding to fail cells of the first memory cell block when a multi-bit error occurs in a second row of normal memory cells of the first memory cell block.

7. The memory device of claim 6, wherein the memory device is configured to perform a redundancy operation, which includes making the second row of normal memory cells of the first memory cell block not selectable, and making the second set of memory cells of the second memory cell block selectable instead of the second row of normal memory cells of the first memory cell block.

8. The memory device of claim 6, wherein the memory device is configured to use the second memory cell block for storing error correction data when a fail cell in a row of memory cells of a sub-block of the normal memory cells is the only fail cell in the row, and to use the second memory cell block for redundancy operations when the fail cell is one of at least two fail cells in a row of memory cells of a sub-block of the normal memory cells.

9. The memory device of claim 6, further comprising:
a switching control circuit; and
a plurality of switching circuits, each corresponding to a respective sub-block of the plurality of sub-blocks,
wherein the switching control circuit controls each of the switching circuits based on whether a 1-bit error or a multi-bit error occurs in a corresponding sub-block.

10. The memory device of claim 6,
wherein the fail address storing unit stores an address of the fail cells for comparing an address applied from the outside with the address of the fail cells, and for repairing the fail cells by using a redundancy repair operation of the second memory cell block when the multi-bit error occurs.

11. The memory device of claim 6, wherein the memory device is further configured to:
receive a first address corresponding to a first row of normal memory cells of the first sub-block;
use a first set of memory cells of the second memory cell block for error correction when the one-bit error occurs in the first row of normal memory cells of the first sub-block; and use the first set of memory cells of the second memory cell block for redundancy operations when the multi-bit error occurs in the first row of normal memory cells of the first sub-block.

12. A memory apparatus comprising:
a memory device, including:
a plurality of first memory cell blocks including first memory cells;
a second memory cell block including second memory cells, the second memory cell block storing in a first row of the second memory cells parity bits of an error correction code (ECC) operation for repairing a first fail cell from among the first memory cells in the first memory cell blocks;
a fail address storing unit configured to store fail address, the fail addresses indicating a first fail address and a second fail address, the first fail address and the second fail address indicating the first fail cell and a second fail cell respectively;
a control logic circuit for comparing an address applied from the outside with the fail addresses stored in the fail address storing unit, and repairing the second fail cell by using a redundancy repair operation of the second memory cell block to store corresponding data in a second row of the second memory cells when the second fail cell is not repairable by the ECC operation; and
an ECC circuit for performing the ECC operation with a codeword including the first fail cell.

13. The memory apparatus of claim 12, wherein the ECC circuit is configured to change the size of the codeword and the size of the parity bits to perform the ECC operation.

14. The memory apparatus of claim 12, wherein the control logic circuit is configured to, during the redundancy repair operation, make a data line connected to the second fail cell in one of the first memory cell blocks not selectable, and make a data line of the second memory cell block selectable instead of the data line of the one first memory cell block.

15. The memory apparatus of claim 12, wherein the control logic circuit is configured to, during the redundancy repair operation, make a first block including the second fail cell in one of the first memory cell blocks not selectable, and make a second block of the second memory cell block selectable instead of the one first memory cell block.

16. The memory apparatus of claim 12, wherein the ECC circuit is configured to, during a write operation of the memory device, generate the parity bits regarding the codeword that is written into the first memory cells including the first fail cell.

17. The memory apparatus of claim 12, wherein the ECC circuit is configured to, during a read operation of the memory device, detect a location of an error bit of the codeword by using the codeword, which is read from the first memory cells including the first fail cell, and the first parity bits, which are read from the second memory cells, correct error bit data, and output error-corrected data.

18. The memory apparatus of claim 12, wherein the ECC circuit is configured to generate first parity bits regarding a first codeword corresponding to the data per one unit of the first memory cell block, generate second parity bits regarding a second codeword obtained by dividing the first codeword in half, and store the first parity bits or the second parity bits in the second memory cells.

19. The memory apparatus of claim 12, wherein the memory device is configured to use the second memory cell block for storing error correction data when the first fail cell is the only fail cell in a row of memory cells of the first memory cell blocks, and to use the second memory cell block for redundancy operations when the second fail cell is one of at least two fail cells in a row of memory cells of the first memory cell blocks.

20. The memory apparatus of claim 12, wherein the second memory cell block is disposed to be adjacent to both sides of the plurality of first memory cell blocks.

21. The memory apparatus of claim 12, further comprising:
   a memory module, including:
   a printed circuit board; and
   a plurality of memory chips mounted on the printed circuit board,
   wherein each of the plurality of chips includes the memory device.

22. The memory apparatus of claim 12, wherein the first row of the second memory cell block and the second row of the second memory cell block share the same bit lines.

23. The memory device of claim 12, wherein the first memory cell block and the second memory cell block share the same word lines.

* * * * *